United States Patent
Zamir et al.

(10) Patent No.: US 11,914,862 B2
(45) Date of Patent: Feb. 27, 2024

(54) DATA COMPRESSION WITH ENTROPY ENCODING

(71) Applicant: Western Digital Technologies, Inc., San Jose, CA (US)

(72) Inventors: Ran Zamir, Ramat Gan (IL); Idan Alrod, Herzliya (IL); Eran Sharon, Rishon Lezion (IL)

(73) Assignee: Western Digital Technologies, Inc., San Jose, CA (US)

( * ) Notice: Subject to any disclaimer, the term of this patent is extended or adjusted under 35 U.S.C. 154(b) by 199 days.

(21) Appl. No.: 17/701,578

(22) Filed: Mar. 22, 2022

(65) Prior Publication Data

US 2023/0305703 A1    Sep. 28, 2023

(51) Int. Cl.
*G06F 3/06* (2006.01)
*H03M 7/30* (2006.01)
*H03M 7/40* (2006.01)
*H03M 7/42* (2006.01)
*G10L 19/00* (2013.01)

(52) U.S. Cl.
CPC ............ *G06F 3/0608* (2013.01); *G06F 3/064* (2013.01); *G06F 3/0679* (2013.01); *H03M 7/3088* (2013.01); *H03M 7/40* (2013.01); *H03M 7/42* (2013.01); *H03M 7/6011* (2013.01); *H03M 7/6094* (2013.01); *G10L 2019/0007* (2013.01)

(58) Field of Classification Search
CPC ........ H03M 7/3088; H03M 7/40; H03M 7/42; H03M 7/6011; H03M 7/6094; H03M 7/3086; H03M 7/6029; H03M 7/4056
See application file for complete search history.

(56) References Cited

U.S. PATENT DOCUMENTS

| | | | |
|---|---|---|---|
| 5,623,701 A | 4/1997 | Bakke et al. | |
| 5,819,215 A * | 10/1998 | Dobson | G11B 20/00007 |
| 7,889,102 B2 | 2/2011 | Schneider | |
| 8,171,251 B2 | 5/2012 | Ziv et al. | |
| 8,370,544 B2 | 2/2013 | Lu et al. | |
| 8,704,683 B2 * | 4/2014 | Lee | H03M 11/24 |
| | | | 341/26 |
| 8,704,686 B1 | 4/2014 | Agarwal et al. | |
| 10,270,464 B1 * | 4/2019 | Guilford | H03M 7/3086 |
| 10,454,498 B1 | 10/2019 | Mao | |
| 10,621,116 B2 * | 4/2020 | Brief | G11C 7/1006 |
| 10,691,537 B2 * | 6/2020 | Sun | H03M 13/356 |
| 11,095,305 B1 * | 8/2021 | Guilford | H03M 7/40 |

(Continued)

*Primary Examiner* — Lam T Mai

(74) *Attorney, Agent, or Firm* — Vierra Magen Marcus LLP

(57) ABSTRACT

An apparatus includes a first encoder circuit configured to compress a block of data using dictionary based compression and a second encoder circuit connected to the first encoder circuit to receive the compressed block of data from the first encoder circuit. The second encoder circuit is configured to further compress the compressed block of data according to a codebook. The codebook is based on a distribution of data of a prior block of data or a distribution of data of a portion of the block of data that is less than the block of data. The operation of the second encoder circuit overlaps with the operation of the first encoder circuit to achieve high throughput and avoid the need for a large block of memory (e.g., SRAM) to occupy the data in flight until the second encoder circuit can start.

20 Claims, 21 Drawing Sheets

Compression 400

Dictionary 510
- Dictionary Based compression 512
- Data distribution Calculation 514

Entropy 520
- Codebook Calculation 522
- Entropy Based Compression 524

(56) References Cited

U.S. PATENT DOCUMENTS

| | | | |
|---|---|---|---|
| 11,789,612 B2 * | 10/2023 | Inbar | G06F 3/0679 |
| | | | 711/3 |
| 2006/0149538 A1 * | 7/2006 | Lee | G10L 21/038 |
| | | | 704/219 |
| 2018/0358989 A1 * | 12/2018 | Mehra | H03M 13/2918 |
| 2020/0117539 A1 * | 4/2020 | Sun | H03M 13/1105 |
| 2021/0351790 A1 * | 11/2021 | Guilford | H03M 7/30 |
| 2021/0373993 A1 * | 12/2021 | Sharon | G11C 16/0483 |
| 2021/0389879 A1 * | 12/2021 | Inbar | G06F 3/0656 |
| 2022/0091752 A1 * | 3/2022 | Singla | H03M 7/6011 |
| 2022/0187994 A1 * | 6/2022 | Fukazawa | H03M 7/6029 |
| 2023/0107760 A1 * | 4/2023 | Cooper | H03M 7/3084 |
| | | | 711/114 |
| 2023/0289293 A1 * | 9/2023 | Yashima | G06F 3/0679 |

* cited by examiner

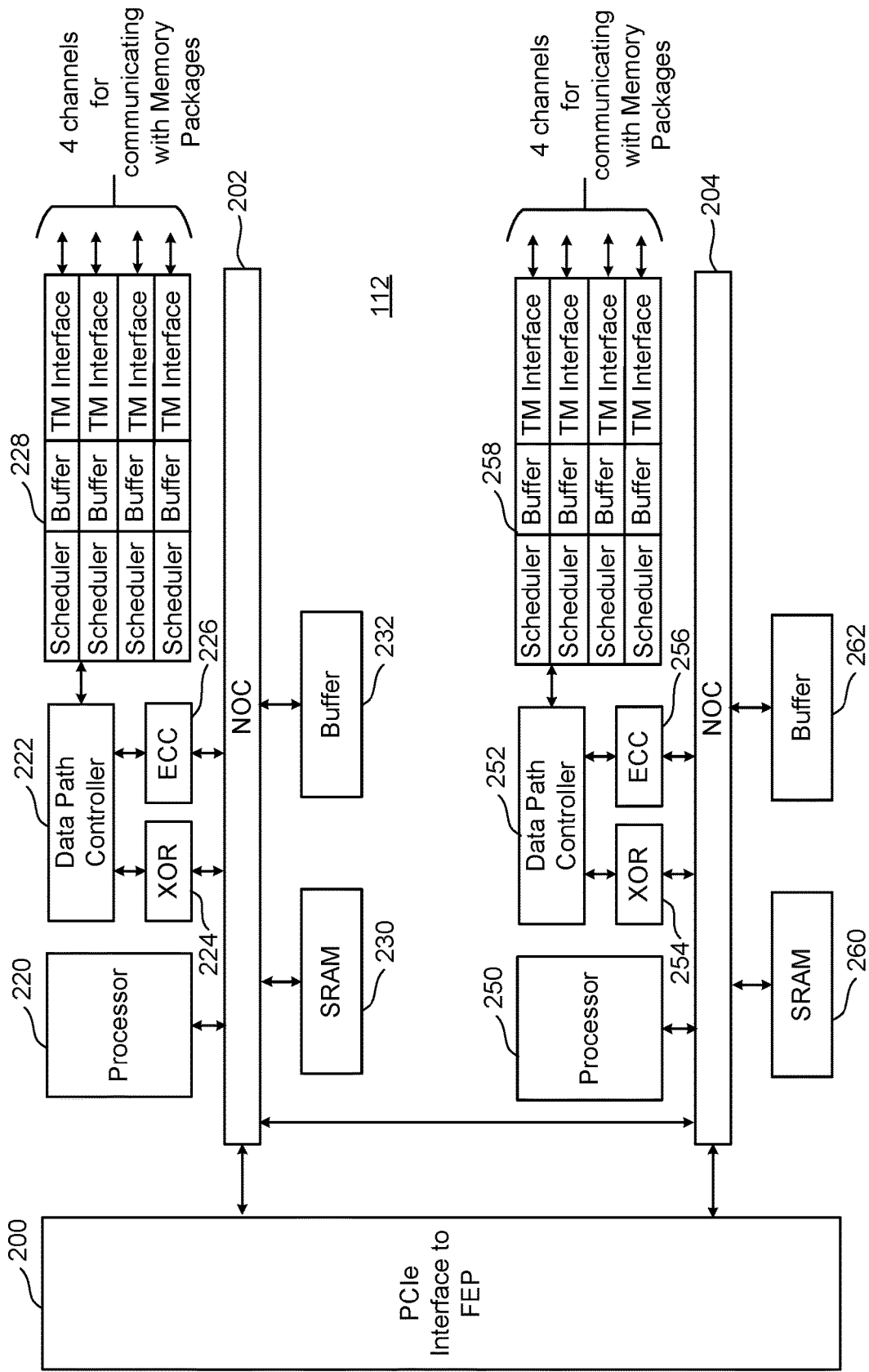

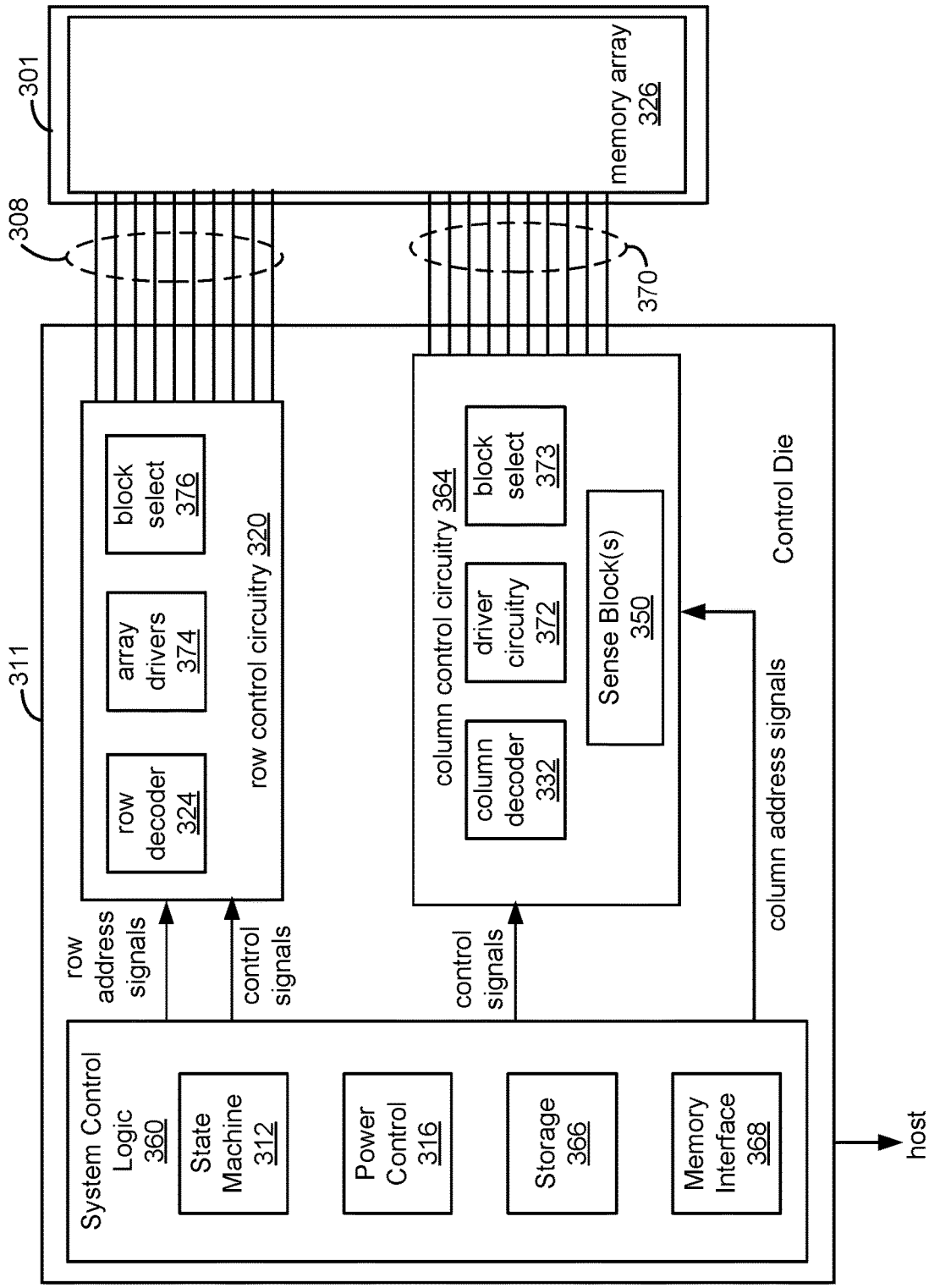

DATA COMPRESSION WITH ENTROPY ENCODING

BACKGROUND

The present technology is directed to storage devices and data compression.

Semiconductor memory is widely used in various electronic devices such as cellular telephones, digital cameras, personal digital assistants, medical electronics, mobile computing devices, non-mobile computing devices and data servers. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory), Electrically Erasable Programmable Read-Only Memory (EEPROM), and others. Some memory cells store information by storing a charge in a charge storage region. Other memory cells store information using other techniques, such as by the resistance of the memory cell. Some memories store one bit per cell using two data states (Single Level Cell or SLC) while others store more than one bit per cell using more than two data states (Multi Level Cell or MLC, which may store two bits per cell). Storing four bits per cell may use sixteen data states (Quad Level Cell or QLC).

When a memory system is deployed in or connected to an electronic device (the host), the memory system can be used to store data and read data. Data may be compressed prior to storage for efficient use of storage capacity in a memory system. In some cases, dedicated circuits may be provided for compression of data in a memory system (hardware compression). While compression may allow more efficient use of storage capacity, there may be some cost, for example, in terms of data throughput and latency. Applying efficient compression for a range of different data in different conditions (e.g., different throughput requirements and/or system states) may be challenging.

With the emerging fields of storage compute and advanced data center storage network topologies, there has been a renewed interest in data compression to enable and enhance overall data center performance by compressing the data to improve the storage capacity and/or to reduce the data bandwidth on the common network busses. Software-based compression algorithms are work well, however, they usually are limited to throughputs on the order of hundreds of MB/s even with state-of-the-art CPUs. Therefore, such software-based methods are not suitable for data centers and storage devices working on ~GB/s of data. For these scenarios, hardware-based compression accelerators are needed to support high-throughput data center/storage compute use-cases. This present technology provides improvements to the hardware compression engine pipeline. By improving the pipeline, and algorithms, higher throughput is achievable.

BRIEF DESCRIPTION OF THE DRAWINGS

Like-numbered elements refer to common components in the different Figures.

FIG. 1C is a block diagram of one embodiment of a Back End Processor Circuit. In some embodiments, the Back End Processor Circuit is part of a Controller.

FIG. 2B is a functional block diagram of an embodiment of an integrated memory assembly.

DETAILED DESCRIPTION

Circuits and techniques are disclosed herein to enable efficient compression of data. For example, data may be compressed prior to storage in a non-volatile memory so that the amount of memory occupied by the data is less than if it was uncompressed. Compression may also be used to reduce the size of data transferred between a host and a storage device, which may have several benefits including, for example, higher transfer speeds and reduced power consumption. This may allow efficient use of space in a data storage system (e.g., a solid state drive, data storage system comprising multiple solid state drives, memory card(s), or other data storage system). In some examples, a compression circuit (e.g., between a host and a non-volatile memory of a data storage system) may perform dictionary based compression and entropy compression, where entropy compression uses a code (e.g., Huffman code) to generate a codebook that assigns a unique bit string to each symbol found. The assignment of bit strings to symbols may be based on an observed or expected distribution of symbols in the data being compressed (see examples below). Entropy compression may be adapted for high throughput requirements and/or for a range of throughput and compression requirements and may be controlled dynamically according to the system state to allow efficient compression for a range of data across a range of conditions.

In an example, a codebook for entropy compression of a block of data may be obtained from the distribution of symbols found in the entire block of data (e.g., during dictionary based compression) or from the distribution of symbols found in a portion of the block of data (some fraction of the block, less than the entire block). A codebook for entropy compression of a block of data may be obtained from the distribution of symbols in another block of data (e.g., a prior block of data). Entropy coding may be rolled back if entropy coding is not acceptable (e.g., a block of data may be subject to entropy coding using a new or recalculated codebook if the original codebook does not meet some metric). A codebook may be selected from a plurality of previously-calculated codebooks stored in a codebook library. A codebook may be calculated using a previously-calculated codebook structure (e.g., a tree such as a Huffman tree) and mapping bit strings to symbols. One or more compression parameters may be controlled dynamically according to the system state in a manner that is adaptive to changes (e.g., increasing throughput as needed and increasing compression when throughput requirements allow it). For example, different compression methods may be used at different times to compress different blocks of data in an adaptive manner.

Figure 1A:
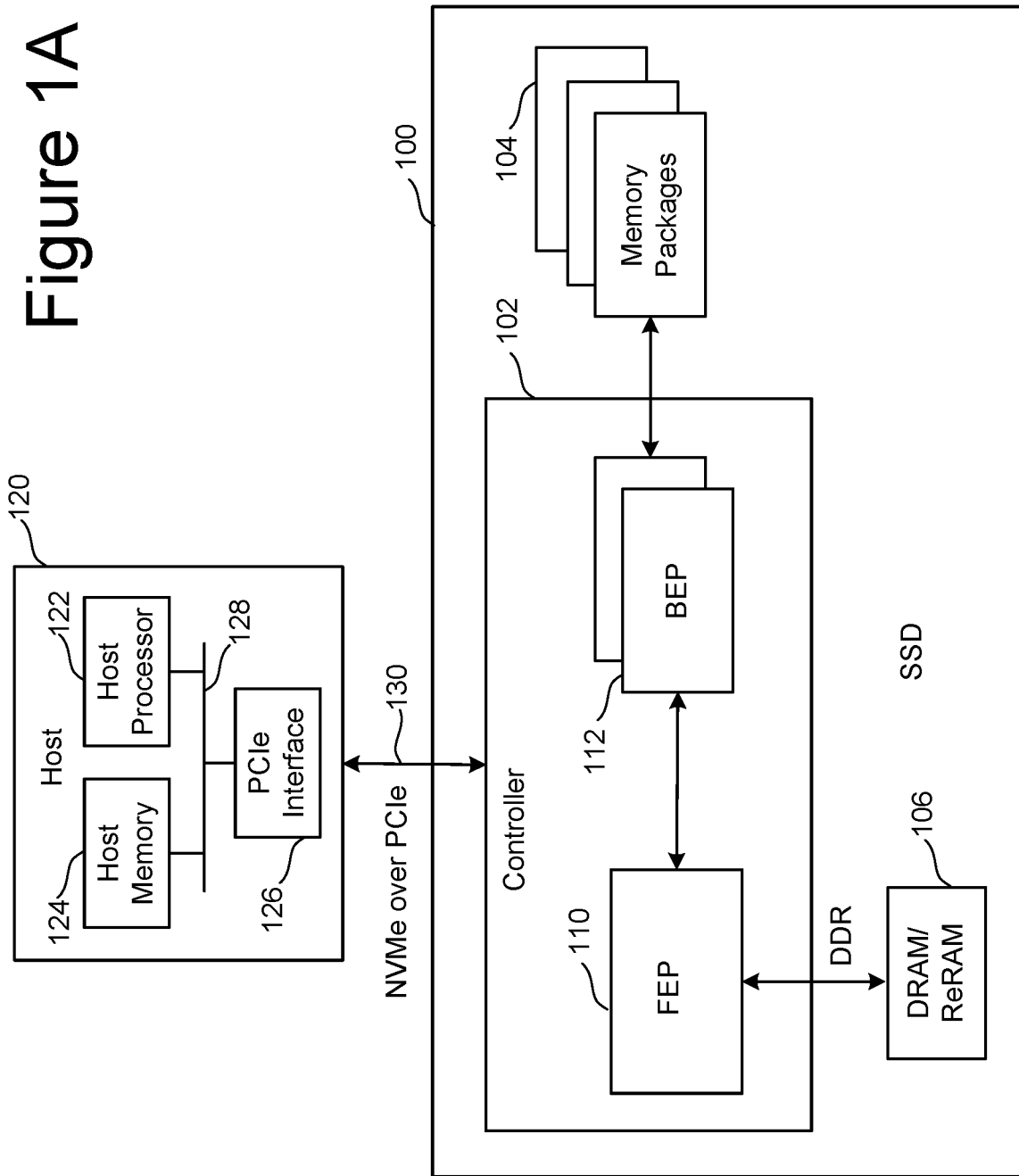
FIG. 1A is a block diagram of one embodiment of a memory system connected to a host.

FIG. 1A is a block diagram of one embodiment of a memory system 100 connected to a host 120. Memory system 100 can implement the technology proposed herein. Many different types of memory systems can be used with the technology proposed herein. One example memory system is a solid-state drive ("SSD"); however, other types of memory systems can also be used. Memory system 100 comprises a controller 102, non-volatile memory 104 for storing data, and local memory (e.g., DRAM/ReRAM) 106. Controller 102 comprises a Front-End Processor Circuit (FEP) 110 and one or more Back End Processor Circuits (BEP) 112. In one embodiment FEP circuit 110 is implemented on an ASIC. In one embodiment, each BEP circuit 112 is implemented on a separate ASIC. The ASICs for each of the BEP circuits 112 and the FEP circuit 110 are implemented on the same semiconductor such that the Controller 102 is manufactured as a System on a Chip ("SoC"). FEP 110 and BEP 112 both include their own processors. In one embodiment, FEP circuit 110 and BEP 112 work as a master slave configuration where the FEP circuit 110 is the master, and each BEP 112 is a slave. For example, FEP circuit 110 implements a flash translation layer that performs memory management (e.g., garbage collection, wear leveling, etc.), logical to physical address translation, communication with the host, management of DRAM (local volatile memory) and management of the overall operation of the SSD (or other non-volatile storage system). The BEP circuit 112 manages memory operations in the memory packages/die at the request of FEP circuit 110. For example, the BEP circuit 112 can carry out the read, erase and programming processes. Additionally, the BEP circuit 112 can perform buffer management, set specific voltage levels required by the FEP circuit 110, perform error correction (ECC), control the Toggle Mode interfaces to the memory packages, etc. In one embodiment, each BEP circuit 112 is responsible for its own set of memory packages. Controller 102 is one example of a control circuit.

In one embodiment, non-volatile memory 104 comprises a plurality of memory packages. Each memory package includes one or more memory die. Therefore, Controller 102 is connected to one or more non-volatile memory die. In one embodiment, each memory die in the memory packages 14 utilize NAND flash memory (including two-dimensional NAND flash memory and/or three-dimensional NAND flash memory). In other embodiments, the memory package can include other types of memory.

Controller 102 communicates with host 120 via an interface 130 that implements NVM Express (NVMe) over PCI Express (PCIe). For working with memory system 100, host 120 includes a host processor 122, host memory 124, and a PCIe interface 126 connected to bus 128. Host memory 124 is the host's physical memory, and can be DRAM, SRAM, non-volatile memory or another type of storage. Host 120 is external to and separate from memory system 100. In one embodiment, memory system 100 is embedded in host 120.

Figure 1B:
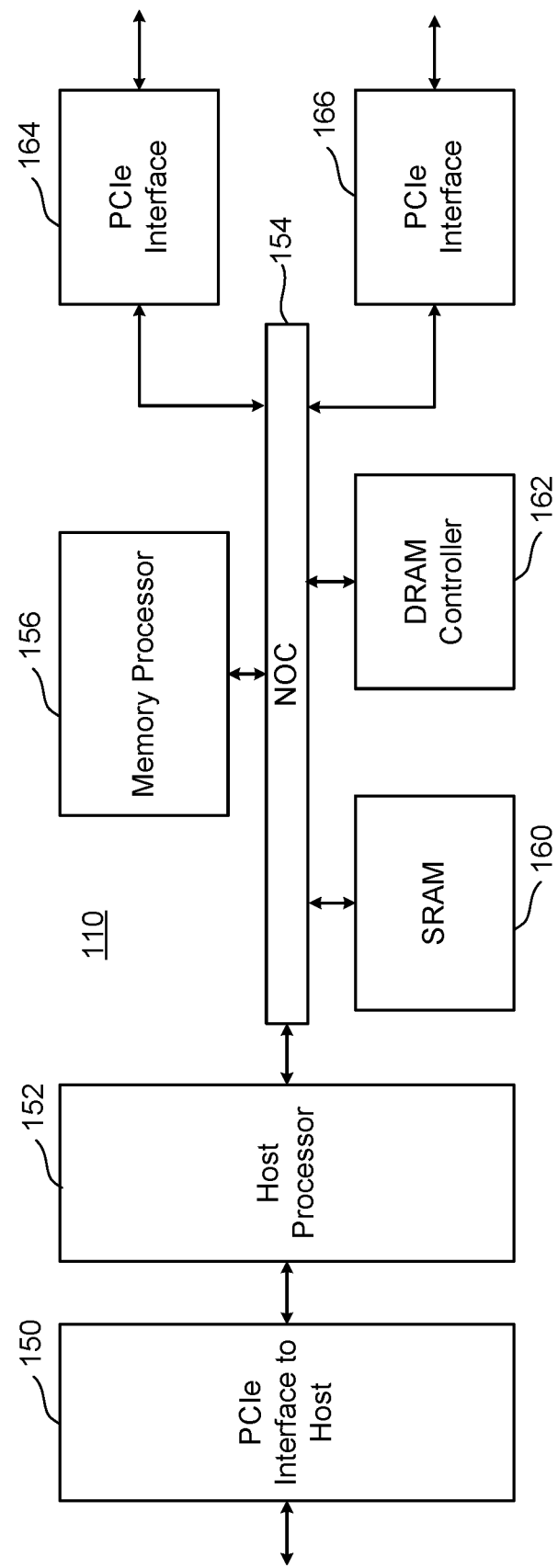
FIG. 1B is a block diagram of one embodiment of a Front-End Processor Circuit. In some embodiments, the Front-End Processor Circuit is part of a Controller.

FIG. 1B is a block diagram of one embodiment of FEP circuit 110. FIG. 1B shows a PCIe interface 150 to communicate with host 120 and a host processor 152 in communication with that PCIe interface. The host processor 152 can be any type of processor known in the art that is suitable for the implementation. Host processor 152 is in communication with a network-on-chip (NOC) 154. A NOC is a communication subsystem on an integrated circuit, typically between cores in a SoC. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of SoCs and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 154 is the memory processor 156, SRAM 160 and a DRAM controller 162. The DRAM controller 162 is used to operate and communicate with the DRAM (e.g., DRAM 106). SRAM 160 is local RAM memory used by memory processor 156. Memory processor 156 is used to run the FEP circuit and perform the various memory operations. Also, in communication with the NOC are two PCIe Interfaces 164 and 166. In the embodiment of FIG. 1B, the SSD controller will include two BEP circuits 112; therefore, there are two PCIe Interfaces 164/166. Each PCIe Interface communicates with one of the BEP circuits 112. In other embodiments, there can be more or less than two BEP circuits 112; therefore, there can be more than two PCIe Interfaces.

FIG. 1C is a block diagram of one embodiment of the BEP circuit 112. FIG. 1C shows a PCIe Interface 200 for communicating with the FEP circuit 110 (e.g., communicating with one of PCIe Interfaces 164 and 166 of FIG. 1B). PCIe Interface 200 is in communication with two NOCs 202 and 204. In one embodiment the two NOCs can be combined to one large NOC. Each NOC (202/204) is connected to SRAM (230/260), a buffer (232/262), processor (220/250), and a data path controller (222/252) via an XOR engine (224/254) and an ECC engine (226/256). The ECC engines 226/256 are used to perform error correction, as known in the art. The XOR engines 224/254 are used to XOR the data so that data can be combined and stored in a manner that can be recovered in case there is a programming error. Data path controller 22 is connected to an interface module for communicating via four channels with memory packages. Thus, the top NOC 202 is associated with an interface 228 for four channels for communicating with memory packages and the bottom NOC 204 is associated with an interface 258 for four additional channels for communicating with memory packages. Each interface 228/258 includes four Toggle Mode interfaces (TM Interface), four buffers and four schedulers. There is one scheduler, buffer and TM Interface for each of the channels. The processor can be any standard processor known in the art. The data path controllers 222/252 can be a processor, FPGA, microprocessor or other type of controller. The XOR engines 224/254 and ECC engines 226/256 are dedicated hardware circuits, known as hardware accelerators. In other embodiments, the XOR engines 224/254 and ECC engines 226/256 can be implemented in software. The scheduler, buffer, and TM Interfaces are hardware circuits.

Figure 1D:
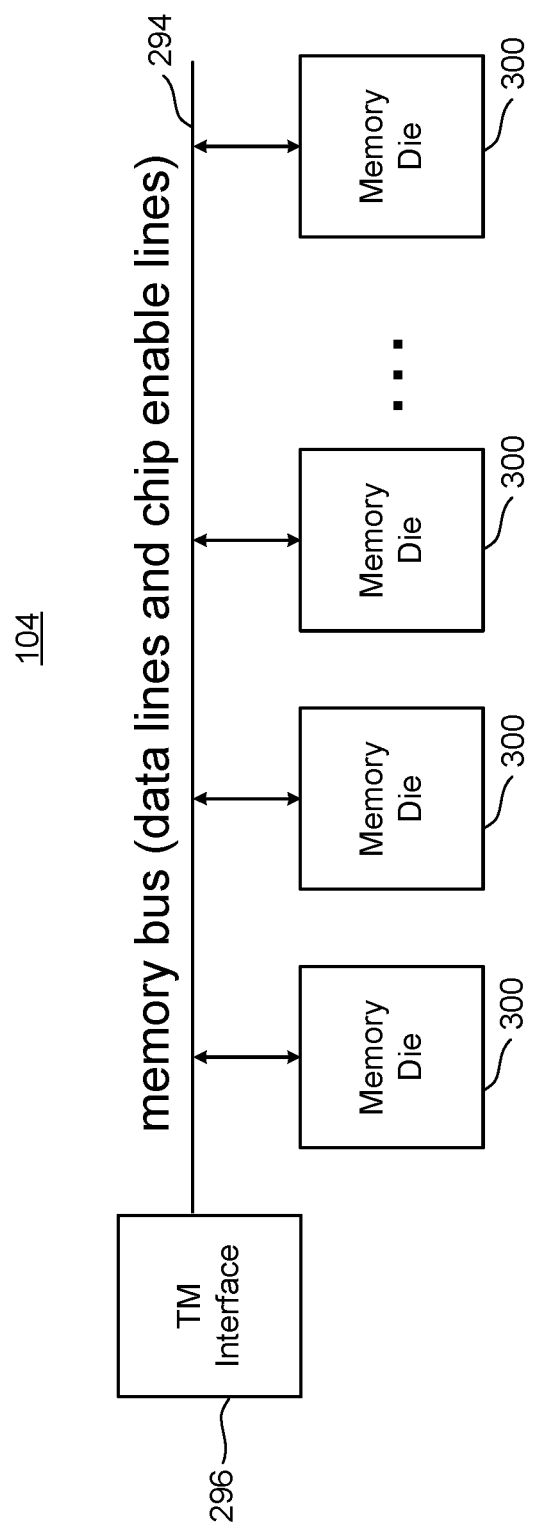
FIG. 1D is a block diagram of one embodiment of a memory package.

FIG. 1D is a block diagram of one embodiment of a memory package 104 that includes a plurality of memory die 300 connected to a memory bus 294 (data lines and chip enable lines). The memory bus 294 connects to a Toggle Mode Interface 296 for communicating with the TM Interface of a BEP circuit 112 (see e.g., FIG. 1C). In some embodiments, the memory package can include a small controller connected to the memory bus and the TM Interface. The memory package can have one or more memory die. In one embodiment, each memory package includes eight or 16 memory die; however, other numbers of memory die can also be implemented. The technology described herein is not limited to any particular number of memory die.

Figure 2A:
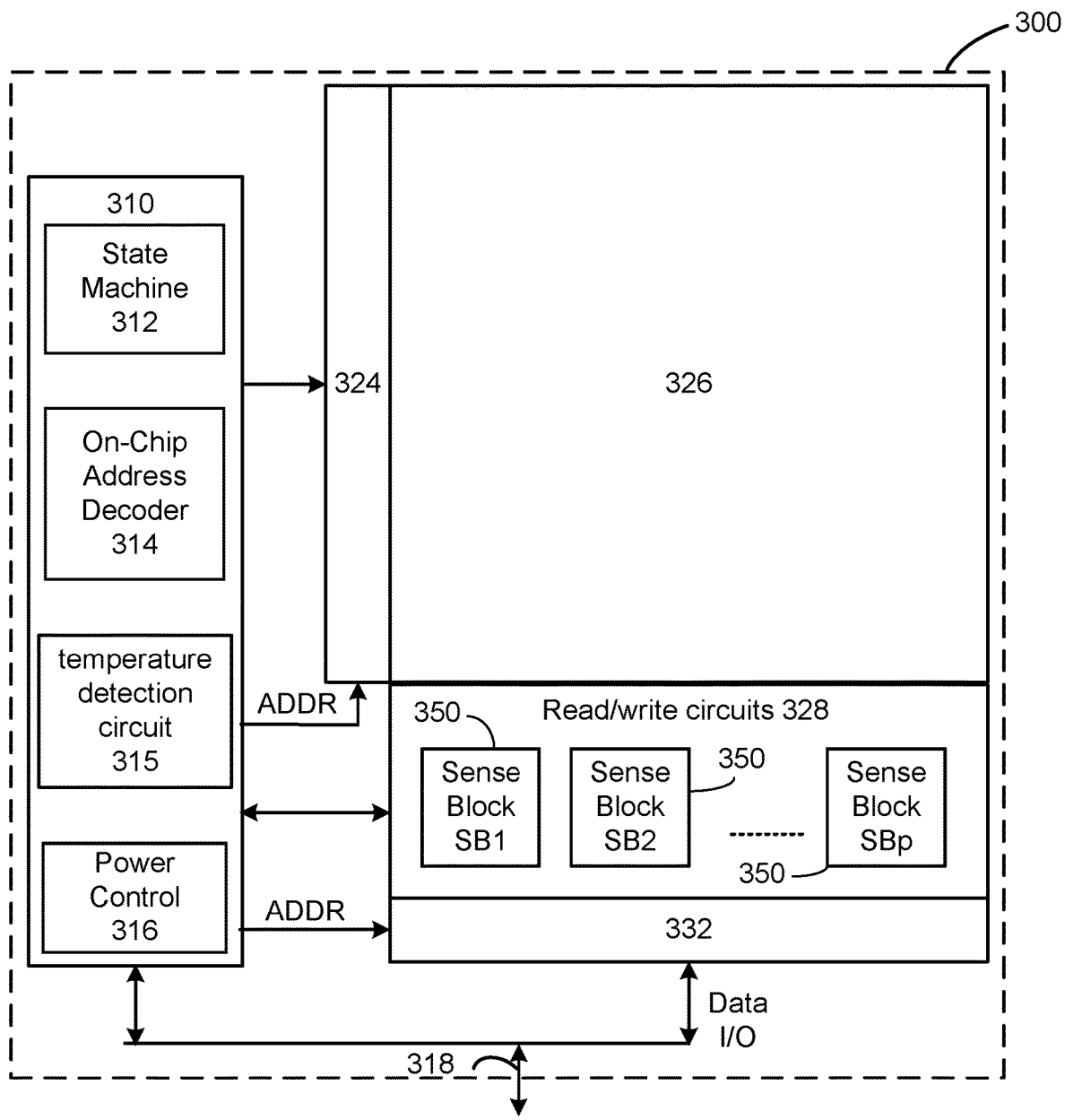
FIG. 2A is a functional block diagram of an embodiment of a memory die.

FIG. 2A is a functional block diagram of one embodiment of a memory die 300. Each of the one or more memory die 300 of FIG. 1D can be implemented as memory die 300 of FIG. 2A. The components depicted in FIG. 2A are electrical circuits. In one embodiment, each memory die 300 includes a memory structure 326, control circuits 310, and read/write circuits 328, all of which are electrical circuits. Memory structure 326 is addressable by word lines via a row decoder 324 and by bit lines via a column decoder 332. The read/write circuits 328 include multiple sense blocks 350 including SB1, SB2 . . . , SBp (sensing circuits) and allow a page (or multiple pages) of data in multiple memory cells to be read or programmed in parallel. In one embodiment, each sense block includes a sense amplifier and a set of latches connected to the bit line. The latches store data to be written and/or data that has been read. The sense blocks include bit line drivers.

Commands and data are transferred between the controller and the memory die 300 via lines 318, which may form a bus between memory die 300 and the controller (e.g., memory bus 294). In one embodiment, memory die 300 includes a set of input and/or output (I/O) pins that connect to lines 318.

Control circuits 310 cooperate with the read/write circuits 328 to perform memory operations (e.g., write, read, erase, and others) on memory structure 326. In one embodiment, control circuits 310 includes a state machine 312, an on-chip address decoder 314, a power control module 316 (power control circuit) and a temperature detection circuit 315. State machine 312 provides die-level control of memory operations. In one embodiment, state machine 312 is programmable by software. In other embodiments, state machine 312 does not use software and is completely implemented in hardware (e.g., electrical circuits). In some embodiments, state machine 312 can be replaced by a microcontroller or microprocessor. In one embodiment, control circuits 310 includes buffers such as registers, ROM fuses and other storage devices for storing default values such as base voltages and other parameters.

The on-chip address decoder 314 provides an address interface between addresses used by controller 102 to the hardware address used by the decoders 324 and 332. Power control module 316 controls the power and voltages supplied to the word lines and bit lines during memory operations. Power control module 316 may include charge pumps for creating voltages.

For purposes of this document, control circuits 310, alone or in combination with read/write circuits 328 and decoders 324/332, comprise one or more control circuits for memory structure 326. These one or more control circuits are electrical circuits that perform the functions described below in the flow charts and signal diagrams. In other embodiments, the one or more control circuits can consist only of controller 102, which is an electrical circuit in combination with software, that performs the functions described below in the flow charts and signal diagrams. In another alternative, the one or more control circuits comprise controller 102 and control circuits 310 performing the functions described below in the flow charts and signal diagrams. In another embodiment, the one or more control circuits comprise state machine 312 (or a microcontroller or microprocessor) alone or in combination with controller 102.

In one embodiment, memory structure 326 comprises a monolithic three-dimensional memory array of non-volatile memory cells in which multiple memory levels are formed above a single substrate, such as a wafer. The memory structure may comprise any type of non-volatile memory that is monolithically formed in one or more physical levels of arrays of memory cells having an active area disposed above a silicon (or other type of) substrate. In one example, the non-volatile memory cells of memory structure 326 comprise vertical NAND strings with charge-trapping material such as described, for example, in U.S. Pat. No. 9,721,662, incorporated herein by reference in its entirety. In another embodiment, memory structure 326 comprises a two-dimensional memory array of non-volatile memory cells. In one example, the non-volatile memory cells are NAND flash memory cells utilizing floating gates such as described, for example, in U.S. Pat. No. 9,082,502, incorporated herein by reference in its entirety. Other types of memory cells (e.g., NOR-type flash memory) can also be used.

In one embodiment, the control circuit(s) (e.g., control circuits 310) are formed on a first die, referred to as a control die, and the memory array (e.g., memory structure 326) is formed on a second die, referred to as a memory die. For example, some or all control circuits (e.g., control circuit 310, row decoder 324, column decoder 332, and read/write circuits 328) associated with a memory may be formed on the same control die. A control die may be bonded to one or more corresponding memory die to form an integrated memory assembly. The control die and the memory die may have bond pads arranged for electrical connection to each other. Bond pads of the control die and the memory die may be aligned and bonded together by any of a variety of bonding techniques, depending in part on bond pad size and bond pad spacing (i.e., bond pad pitch). In some embodiments, the bond pads are bonded directly to each other, without solder or other added material, in a so-called Cu-to-Cu bonding process. In some examples, dies are bonded in a one-to-one arrangement (e.g., one control die to one memory die). In some examples, there may be more than one control die and/or more than one memory die in an integrated memory assembly. In some embodiments, an integrated memory assembly includes a stack of multiple control die and/or multiple memory die. In some embodiments, the control die is connected to, or otherwise in communication with, a memory controller. For example, a memory controller may receive data to be programmed into a memory array. The memory controller will forward that data to the control die so that the control die can program that data into the memory array on the memory die.

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 307. One or more integrated memory assemblies 307 may be used in a memory package 104 in memory system 100. The integrated memory assembly 307 includes two types of semiconductor die (or more succinctly, "die"). Memory die 301 includes memory array 326 (memory structure). Memory array 326 may contain non-volatile memory cells.

Control die 311 includes column control circuitry 364, row control circuitry 320 and system control logic 360 (including state machine 312, power control module 316, storage 366, and memory interface 368). In some embodiments, control die 311 is configured to connect to the memory array 326 in the memory die 301. FIG. 2B shows an example of the peripheral circuitry, including control circuits, formed in a peripheral circuit or control die 311 coupled to memory array 326 formed in memory die 301. System control logic 360, row control circuitry 320, and column control circuitry 364 are located in control die 311. In some embodiments, all or a portion of the column control circuitry 364 and all or a portion of the row control circuitry 320 are located on the memory die 301. In some embodiments, some of the circuitry in the system control logic 360 is located on the on the memory die 301.

System control logic 360, row control circuitry 320, and column control circuitry 364 may be formed by a common process (e.g., CMOS process), so that adding elements and functionalities, such as ECC, more typically found on a controller 102 may require few or no additional process steps (i.e., the same process steps used to fabricate controller 102 may also be used to fabricate system control logic 360, row control circuitry 320, and column control circuitry 364). Thus, while moving such circuits from a die such as memory die 301 may reduce the number of steps needed to fabricate such a die, adding such circuits to a die such as control die 311 may not require many additional process steps.

FIG. 2B shows column control circuitry 364 including sense block(s) 350 on the control die 311 coupled to memory array 326 on the memory die 301 through electrical paths 370. For example, electrical paths 370 may provide electrical connection between column decoder 332, driver circuitry 372, and block select 373 and bit lines of memory array (or memory structure) 326. Electrical paths may extend from column control circuitry 364 in control die 311 through pads on control die 311 that are bonded to corresponding pads of the memory die 301, which are connected to bit lines of memory structure 326. Each bit line of memory structure 326 may have a corresponding electrical path in electrical paths 370, including a pair of bond pads, which connects to column control circuitry 364. Similarly, row control circuitry 320, including row decoder 324, array drivers 374, and block select 376 are coupled to memory array 326 through electrical paths 308. Each of electrical path 308 may correspond to a word line, dummy word line, or select gate line. Additional electrical paths may also be provided between control die 311 and memory die 301.

In some embodiments, there is more than one control die 311 and/or more than one memory die 301 in an integrated memory assembly 307. In some embodiments, the integrated memory assembly 307 includes a stack of multiple control die 311 and multiple memory die 301. In some embodiments, each control die 311 is affixed (e.g., bonded) to at least one of the memory dies 301.

The exact type of memory array architecture or memory cell included in memory structure 326 is not limited to the examples above. Many different types of memory array architectures or memory cell technologies can be used to form memory structure 326. No particular non-volatile memory technology is required for purposes of the new claimed embodiments proposed herein. Other examples of suitable technologies for memory cells of the memory structure 326 include ReRAM memories, magnetoresistive memory (e.g., MRAM, Spin Transfer Torque MRAM, Spin Orbit Torque MRAM), phase change memory (e.g., PCM), and the like. Examples of suitable technologies for architectures of memory structure 326 include two dimensional arrays, three dimensional arrays, cross-point arrays, stacked two dimensional arrays, vertical bit line arrays, and the like.

One example of a ReRAM, or PCMRAM, cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse but includes a (continuous or non-continuous) vibration or burst of sound, current, voltage light, or other wave.

A person of ordinary skill in the art will recognize that the technology described herein is not limited to a single specific memory structure, but covers many relevant memory structures within the spirit and scope of the technology as described herein and as understood by one of ordinary skill in the art.

Figure 3:
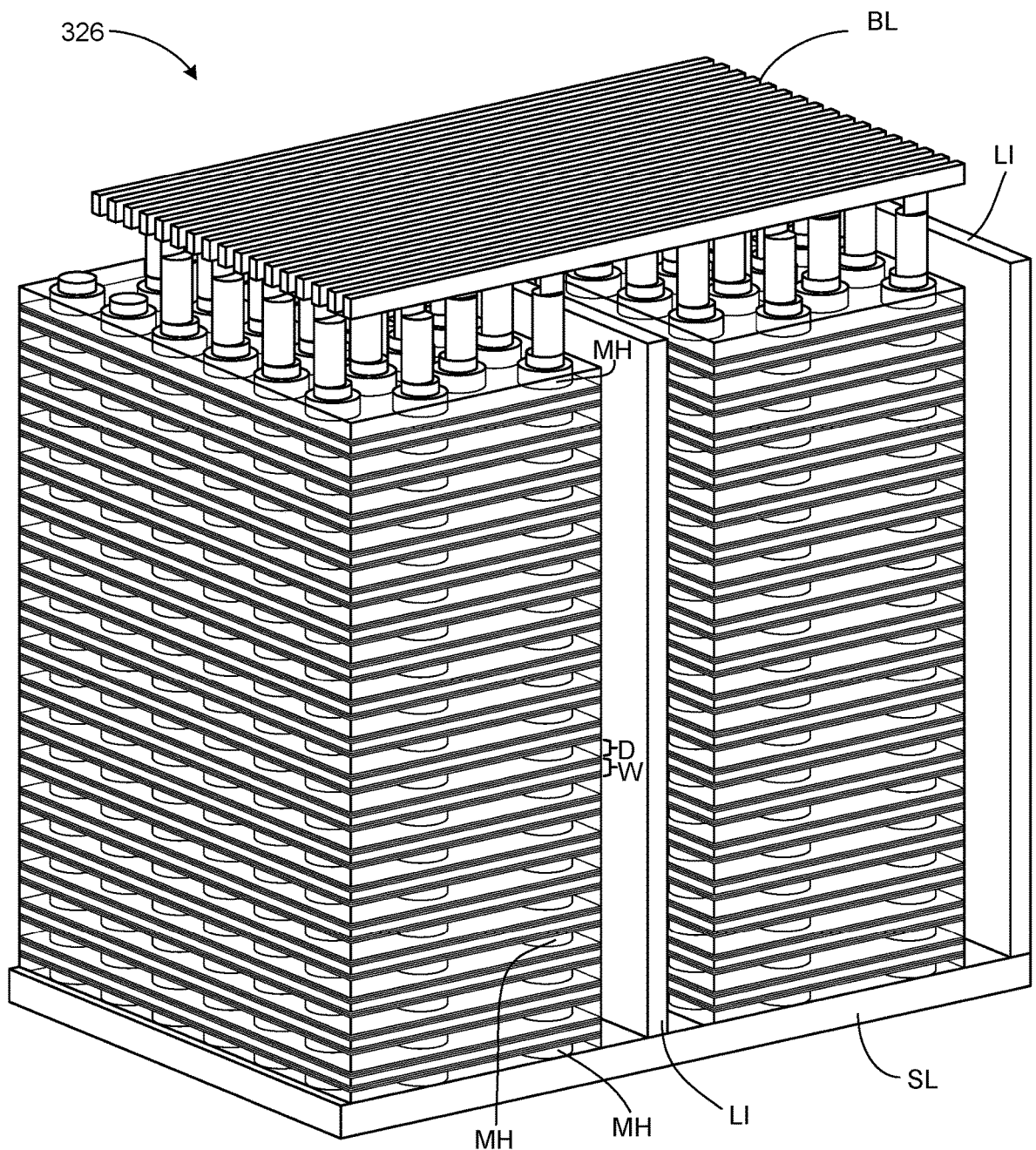
FIG. 3 is a perspective view of a portion of one embodiment of a monolithic three-dimensional memory structure.

FIG. 3 is a perspective view of a portion of one example embodiment of a monolithic three-dimensional memory array that can comprise memory structure 326, which includes a plurality of memory cells. For example, FIG. 3 shows a portion of one block of memory. The structure depicted includes a set of bit lines BL positioned above a stack of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. One set of embodiments includes between 108-278 alternating dielectric layers and conductive layers, for example, 127 data word line layers, 8 select layers, 4 dummy word line layers and 139 dielectric layers. More or fewer than 108-278 layers can also be used.

In some examples described below, data compression is used to reduce the size (e.g., the number of bits) of data to be stored in a non-volatile memory (e.g., in memory structure 326 illustrated in FIG. 3, which may be implemented in memory die 300 of FIG. 2A, memory die 301 of FIG. 2B, or otherwise). Compression may be implemented by dedicated circuits that are configured to perform compression (hardware compression) or by a processor that is configured by software to perform compression (software compression). Examples described below are directed to hardware compression using dedicated circuits, which may allow compression of relatively large amounts of data with high throughput compared with software compression (e.g., in a data center or other location where non-volatile memory may store large amounts of data with high throughput requirements).

Figure 4:
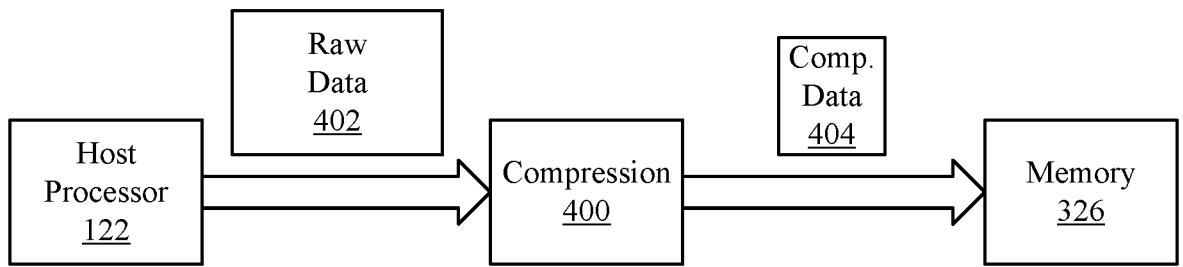
FIG. 4 shows an example of compression of data to be stored in a memory.

FIG. 4 illustrates an example of host processor 122 connected to non-volatile memory structure 326 with compression circuits 400 between host processor 122 and non-volatile memory structure 326 to compress data that is sent from host processor 122 to be stored in non-volatile memory structure 326. For example, raw data 402 (e.g., uncompressed data) is shown being sent from host processor 122 (e.g., as part of a write operation) to compression circuits 400, which performs compression on raw data 402 to generate compressed data 404. Compressed data 404 is sent to non-volatile memory structure 326 and is stored in non-volatile memory structure 326. Compressed data 404 may be smaller (consist of fewer bits) than raw data 402 so that a smaller amount of non-volatile memory structure (e.g., a smaller number of non-volatile memory cells) is occupied by compressed data 404 than would be occupied by raw data 402. While FIG. 4 shows one scenario for compression of data, the present technology is not limited to any particular scenario and data sent in either direction (from host to memory or from memory to host) may be compressed and compression may occur at any location. For example, compression circuit 400 may be located at or near host processor 122 (e.g., in host 120) so that data sent from host processor 122 is compressed before being sent to a memory system (e.g., memory system 100) over a bus or interface (e.g., interface 130). This may reduce bus and/or interface traffic between a host and a memory system. The compressed data may then be stored in non-volatile memory or may be decompressed prior to storage. Compression may also be implemented for data being sent from memory structure 326 to host processor 122 in order to reduce bus and/or interface traffic. For example, compression circuit 400 may be located at or near memory structure 326 and uncompressed data (e.g., read from memory structure 326) may be compressed prior to being sent to host processor 122.

The process illustrated in FIG. 4 may be reversed. For example, in response to a read command from host processor 122, compressed data 404 may be read from non-volatile memory structure 326 and sent to compression circuits 400. Compression circuits 400 may reverse the compression operation to regenerate raw data 402, which is then sent to host processor 122. While the term "compression circuit" is used here, the term "compression/decompression circuit" may also be used where the same circuit is used for both operations. Alternatively, separate decompression circuits may be provided. While examples described below are generally directed to compression of data, the compression circuits described are generally operable to reverse the compression operations they perform to regenerate raw data from compressed data (e.g., to decompress compressed data to return the original data).

Compression circuits 400 may be implemented at any location that is suitable for compressing data sent from host processor 122 prior to storage in non-volatile memory structure 326. For example, compression circuits 400 may be implemented by suitable circuits in controller 102 (e.g., in FEP 110, BEP 112, or as additional circuits), in memory packages 104, in host 120, between host 120 and controller 102, or in some combination of these locations.

Figure 5A:
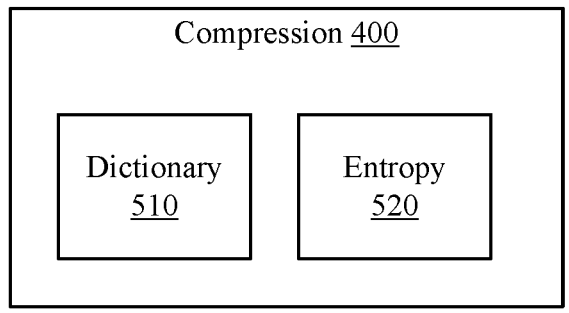
FIGS. 5A-C illustrate aspects of a compression circuit.

Compression circuits such as compression circuits 400 may implement data compression using a variety of different compression techniques. FIG. 5A shows an example embodiment in which compression circuits 400 includes a dictionary encoder circuit 510 and an entropy encoder circuit 520. For example, dictionary encoder circuit 510 may perform dictionary based encoding of data received by compression circuits 400 (e.g., raw data 402) and then entropy encoder circuit 520 may additionally perform entropy based encoding of the data to generate compressed data (e.g., compressed data 404).

Dictionary encoding may be implemented using any suitable dictionary compression scheme. Examples of suitable schemes include schemes developed by Lempel and Ziv ("LZ" schemes) including LZ77 and LZ78. In such schemes repeated occurrences of a portion of data are replaced with references to an earlier copy of the portion of data. When a portion of data (string of characters or bits) is found that matches an earlier portion of data, it is replaced with a reference to the earlier portion (e.g., a distance or offset to the earlier portion and the number of characters that match) or a token or symbol. As the data is analyzed, strings of characters or bits are identified and corresponding entries form a dictionary, with some entries in the dictionary corresponding to a previously found string of characters. In a given block of data, some strings of characters may occur with high frequency while others occur with lower frequency. A data distribution may be obtained that indicates the numbers of occurrences of various strings of characters (symbols) in a portion of data (e.g., for each entry in a dictionary corresponding to a symbol, the number of occurrences of the symbol may be recorded).

Entropy encoding may be implemented using any suitable entropy based compression scheme. Examples of suitable schemes for entropy based compression include prefix codes such as Huffman code, in which variable length bit strings are selected to represent different symbols with none of the bit strings that are used being a prefix of any other bit string so that individual bit strings are identifiable (discussed further below). Bit strings to replace different symbols may be chosen according to the frequency of the symbol, with more frequently occurring symbols being replaced by shorter bit strings and less frequently occurring symbols being replaced by longer bit strings.

Figure 5B:
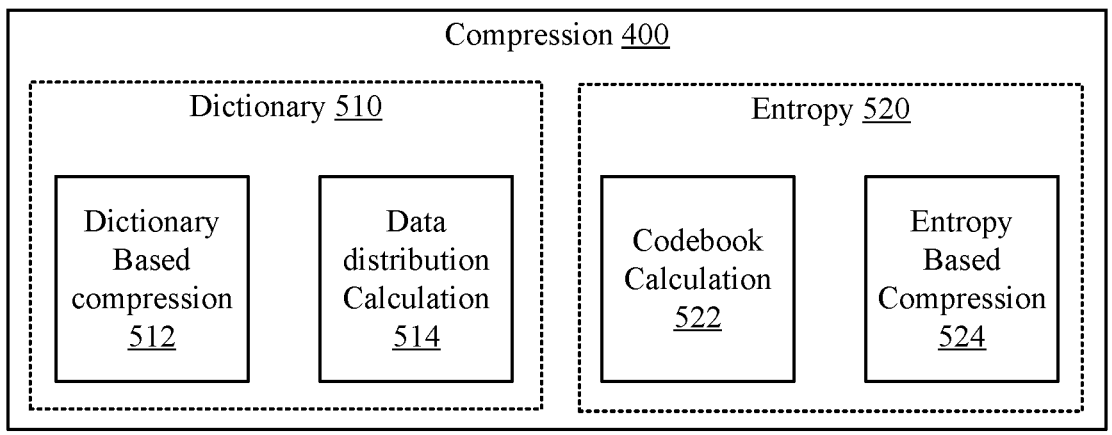

FIG. 5B shows an example implementation of compression circuits 400 in which dictionary encoder circuit 510 includes a dictionary based compression circuit 512 and a data distribution calculation circuit 514 (data distribution calculator). Dictionary based compression circuit 512 may apply LZ77 compression, or other dictionary based compression, to blocks of data in order to generate first compressed blocks of data that may be sent to entropy encoder circuit 520. Data distribution calculation circuit 514 is a circuit that is connected to dictionary based compression circuit 512 to calculate the distributions of blocks of data compressed by dictionary based compression circuit 512. For example, data distribution calculation circuit 514 may generate an output that indicates, for a given block of data, the number of occurrences of each identified symbol in the block of data (e.g., data distribution calculation circuit 514 may generate a histogram of the symbols of a given block, which may be based on the dictionary generated by dictionary based compression circuit 512 for the block). The output of data distribution calculation circuit 514 is sent to entropy encoder circuit 520.

Entropy encoder circuit 520 includes codebook calculation circuit 522, which receives the output of data distribution calculation circuit 514 that indicates the number of occurrences of each identified symbol of a given block. Codebook calculation circuit 522 then calculates an appropriate code based on this information, where a codebook assigns a bit string (codeword) to each identified symbol. For example, codebook calculation circuit 522 may calculate a codebook by assigning shorter bit strings to more frequently occurring symbols and assigning longer bit strings to less frequently occurring bit strings. The codebook that is calculated by codebook calculation circuit 522 may then be sent to entropy based compression circuit 524. Entropy based compression circuit 524 encodes blocks of data according to the codebooks received from codebook calculation circuit. For example, a block of data that has been compressed using dictionary based compression by dictionary based compression circuit 512 (first compression generating first compressed block) may be further compressed by entropy based compression circuit 524 using a codebook calculated by codebook calculation circuit 522 based on a data distribution obtained by data distribution calculation circuit 514 (second compression). While FIG. 5B illustrates data distribution calculation circuit 514 as part of dictionary encoder circuit 510 and codebook calculation circuit 522 as part of entropy encoder circuit 520, these circuits may alternatively be implemented in other locations.

Figure 5C:
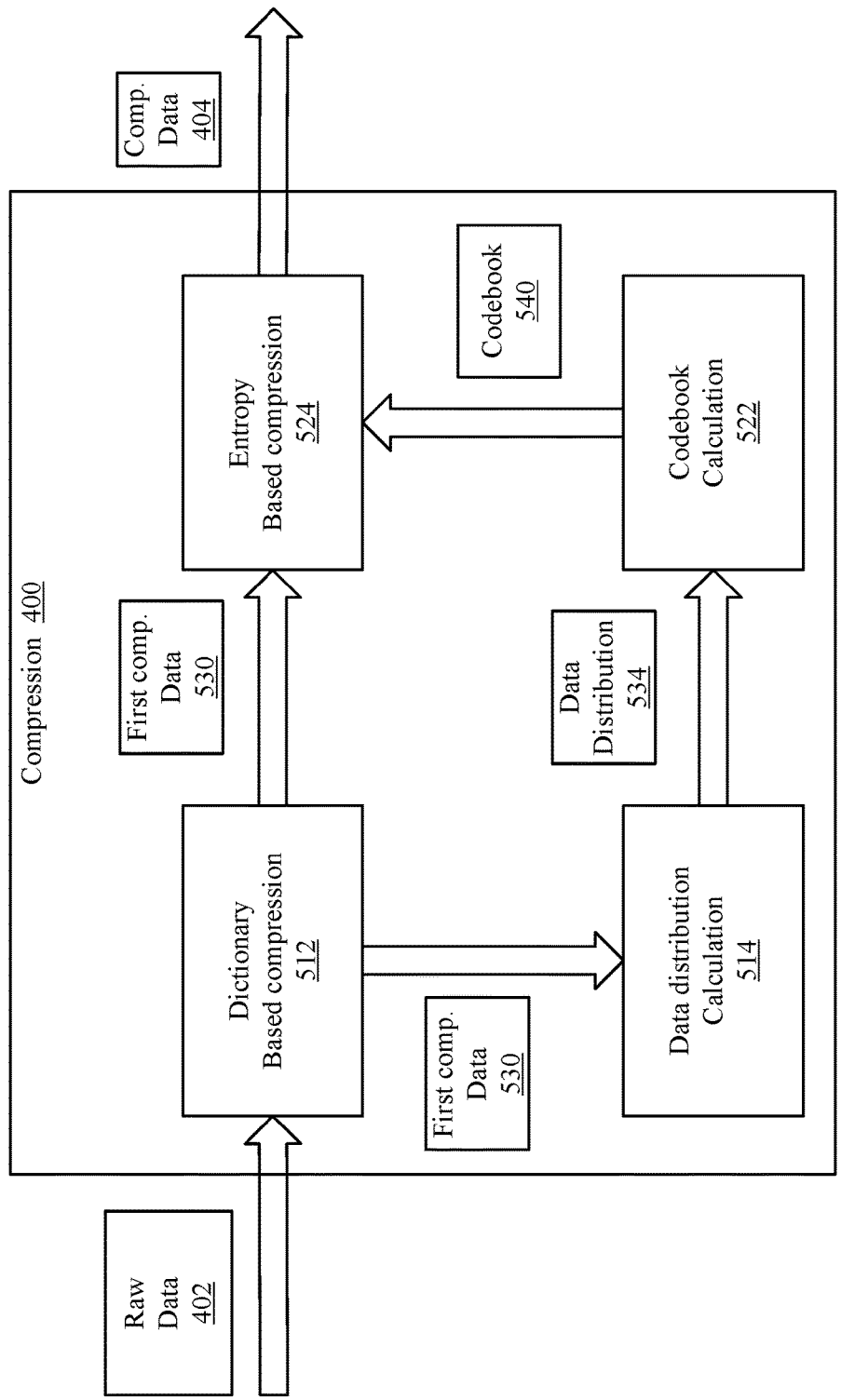

FIG. 5C illustrates an example of operation of compression circuits 400, which shows compression circuits 400 receiving raw data 402 (uncompressed data), which is compressed by dictionary based compression circuit 512 (e.g., using LZ77 or other dictionary based encoding) to generate first compressed data 530, which is sent to entropy based compression circuit 524. Data distribution calculation circuit 514 also uses first compressed data 530, or other data from dictionary based compression circuit 512 reflecting the number of occurrences of different symbols (e.g., a dictionary generated from first compressed data 530), to calculate data distribution 534. For example, for a given block, data distribution calculation circuit 514 may obtain the first compressed data 530 after completion of compression of the block by dictionary based compression circuit 512 or a dictionary generated from it and may subsequently generate data distribution 534 for the block. Alternatively, data distribution calculation circuit 514 may obtain real-time information from dictionary based compression circuit that indicates the number of occurrences of different symbols as they are encountered. Data distribution calculation circuit 514 may maintain an ordered list and may thus generate data distribution 534 for a block at least partially in parallel with compression of the block by dictionary based compression circuit 512.

Data distribution 534 is sent to codebook calculation circuit 522 where it is used to calculate a codebook 540. For example, a codebook may indicate for each symbol in data distribution 534, a corresponding bit string (one or more bits). In one example, the data distribution 534 obtained from a given block of data is used to calculate a codebook for entropy compression of the block of data. In other examples, the codebook used to encode the block of data may be based on a different data distribution as described in examples below.

Figure 6:
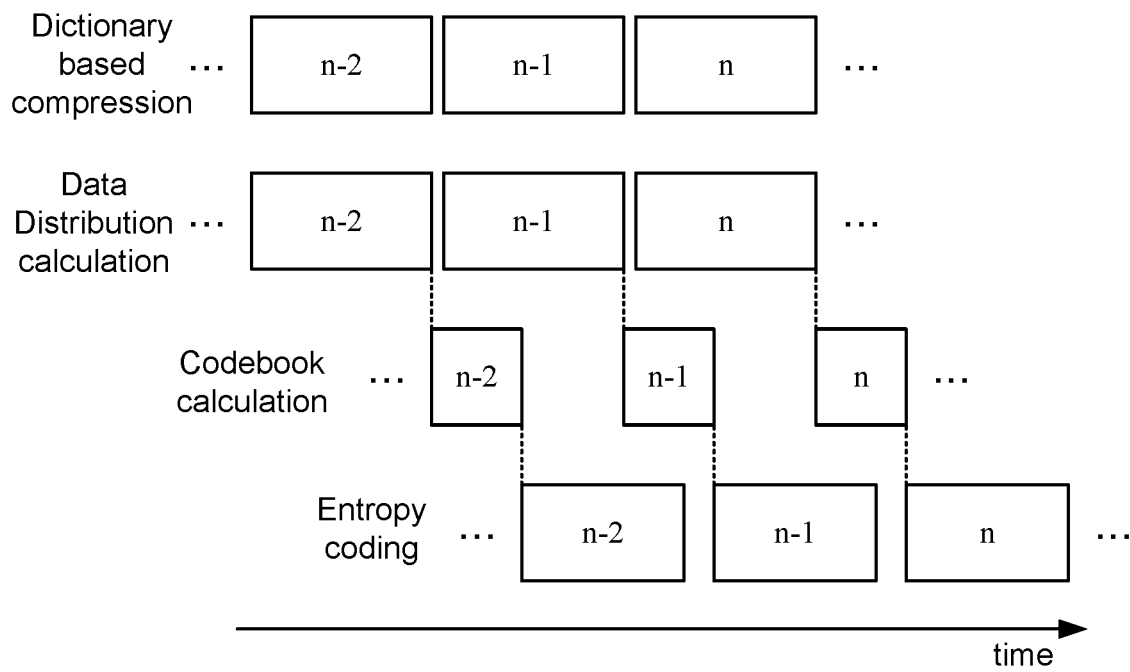
FIG. 6 illustrates an example of compression.

FIG. 6 shows a timing diagram that illustrates an example of compression that may be implemented by compression circuits 400. FIG. 6 illustrates compression of three blocks of data, n−2, n−1, n, which may be blocks within a stream or sequence of such blocks of data (e.g., one or more blocks of a plurality of blocks). The top line shows dictionary based compression of blocks n−2, n−1, n (e.g., compression by dictionary based compression circuit 512) and the second line shows data distribution calculation of blocks n−2, n−1, n (e.g., by data distribution calculation circuit 514) in parallel. The third line shows calculation of codebooks for blocks n−2, n−1, n (e.g., by codebook calculation circuit 522) after their respective data distributions are calculated so that calculation of a codebook for each block is based on the data distribution of that block. The fourth line shows entropy coding of blocks n−2, n−1, n, after corresponding codebook calculation is complete. While dictionary based compression and data distribution are substantially parallel operations in this example, codebook calculation, and entropy coding are illustrated as sequential for a given block (entropy coding for a given block requires a codebook, which means codebook calculation for the block must be complete prior to entropy coding, and codebook calculation requires a distribution of data of the block in this example, so that the data distribution calculation must be complete prior to codebook calculation). In this example, calculation of a codebook from the data of an individual block of data (e.g., block n) starts after the data distribution of the entire individual block of data is fully calculated. Entropy coding of the block (e.g., block n) begins only after the codebook for the individual block is calculated from the corresponding data distribution (e.g., data distribution for block n is calculated from the complete data distribution for block n). The sequential scheme illustrated in FIG. 6 may not be optimal for high throughput situations and may require significant data buffers to store data as it is processed (e.g., to hold block(s) of data while corresponding codebooks are calculated, prior to starting entropy encoding.

Figure 7A:
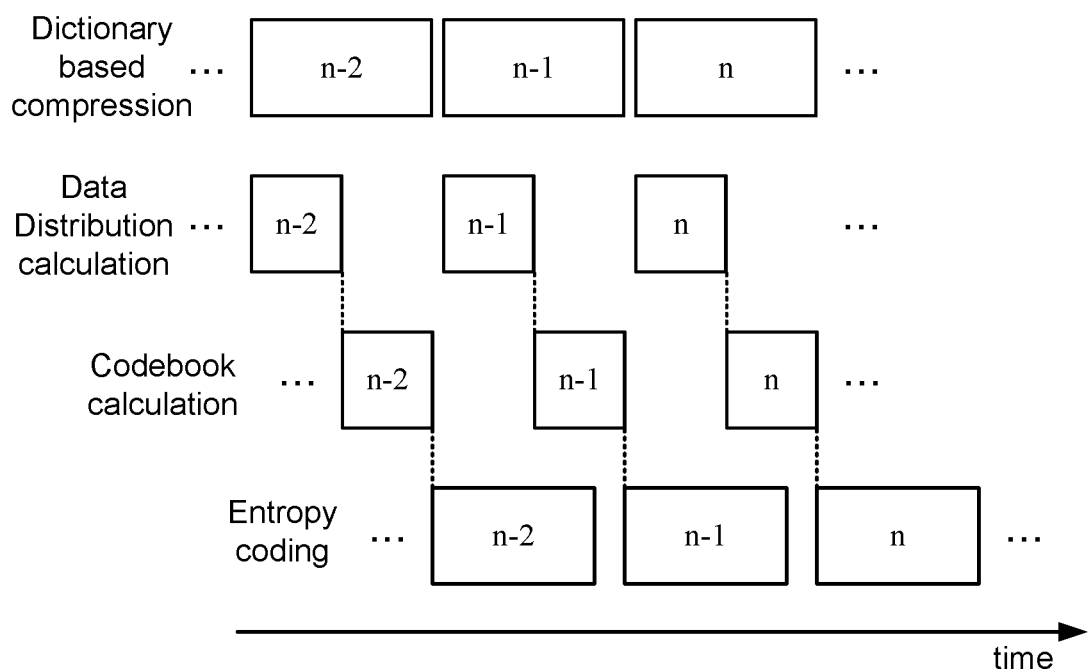
FIGS. 7A-C illustrate examples of compression including calculating a codebook for encoding a block of data from a portion of the block of data.

FIG. 7A shows an example of an alternative compression scheme that allows entropy encoding to begin sooner, thereby reducing latency, enabling higher throughput, and requiring less buffered data, which can reduce hardware costs (e.g., allow use of smaller buffers). While the example of FIG. 6 started codebook calculation for a given block only after data distribution calculation for the entire block was complete, the example of FIG. 7A performs a data distribution calculation using only a portion of a given block of data so that the data distribution can be sent sooner and codebook calculation can begin sooner (e.g., in parallel with dictionary based compression as shown). In this way, entropy coding may begin sooner for a given block. For example, FIG. 7A shows completion of codebook calculation for block n−2 at about the same time that dictionary based compression of block n−2 ends so that entropy coding of block n−2 may begin immediately after dictionary based compression of block n−2 (e.g., without buffering block n−2 between compression operations).

In some examples, an adequate data distribution may be obtained from just a portion of a block of data (less than the full block of data). For example, where data is substantially uniform within a block, the data distribution of a first portion of the block (e.g., first half, first 20%, first 5%, or other fraction or percentage) may be representative of the data distribution of the entire block so that using the data distribution for a portion of the block may not greatly affect codebook selection or the resulting compression rate. In some cases, the fraction of a block that is used for distribution calculation and codebook selection may be controlled dynamically during operation. In other examples, the fraction used is a fixed fraction (e.g., half, quarter, tenth, or another fraction).

In some examples, the data distribution obtained from a portion of a block of data may not adequately represent the data distribution of the entire block of data. For example, where the data within a block of data is not uniform (e.g., one portion of the data has a different distribution of symbols compared with one or more other portions of the data), a data distribution obtained from a portion of a block may result in calculating a codebook that may not be optimal for compressing the block. It may be desirable to identify any such sub-optimal compression and to take steps to address it. For example, where compression is found to be sufficiently sub-optimal, it may be desirable to calculate a new (recalculated) codebook that is better optimized for the data and to recode the data using the new codebook.

Figure 7B:
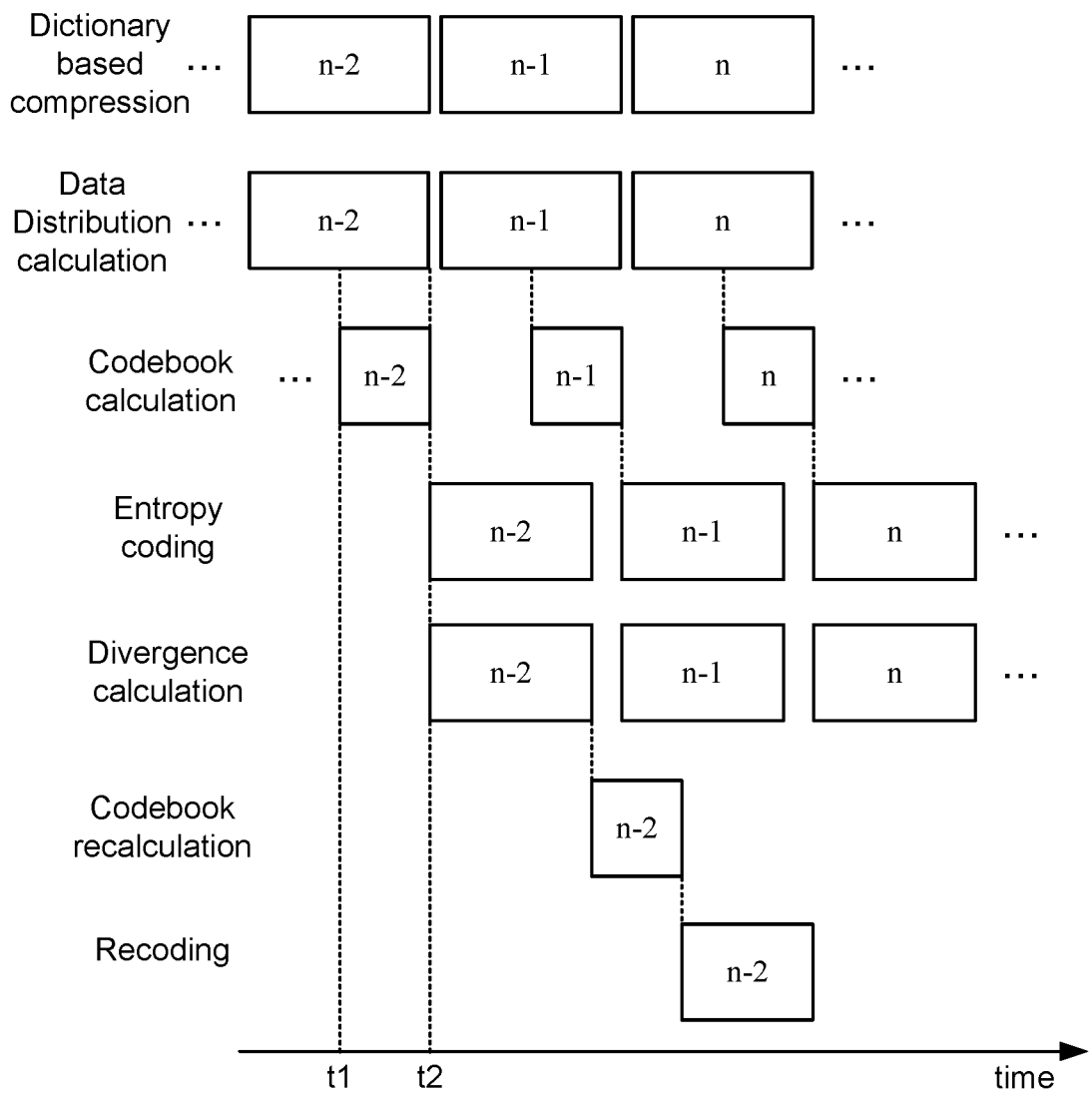

FIG. 7B shows a timing diagram that illustrates an example of compression that is similar to that of FIG. 7A and further includes steps to allow sub-optimal compression of a block to be rolled back so that the block can be recoded in a better-optimized manner. In addition to the steps previously illustrated in FIG. 7A (dictionary based compression, data distribution calculation, codebook calculation, and entropy coding), FIG. 7B shows divergence calculation for each of blocks n−2, n−1, n. Divergence calculation may generate an indication of how close two distributions are. For example, the divergence calculation may compare a data distribution calculated at time t1 from a portion of block n−2 with a data distribution obtained at time t2 from the complete block n−2. The divergence calculation may use Kullback-Leibler divergence (KL divergence, or relative entropy) or other divergence metric as a measure of how divergent two distributions are. If distributions are close (e.g., divergence is less than a threshold) then the data distribution obtained at time t1 (from a fraction of block n−1) the codebook obtained from it may be considered adequate. If distributions are not close (e.g., divergence is greater than the threshold) then the data distribution obtained at time t1 may be considered inadequate because it may not adequately represent the data distribution of the entire block so that the codebook calculated for block n−2 between t1 and t2 may be sub-optimal.

FIG. 7B shows the case where divergence calculation indicates that the divergence between the distribution of a portion of block n−2 obtained at time t1 and the distribution of the entire block n−1 obtained at time t2 exceeds a threshold. In response to this divergence exceeding the threshold, additional steps of codebook recalculation and recoding are performed. Codebook recalculation in this example is based on the data distribution calculation for the entire block n−1, which is obtained at time t2. A new (recalculated) codebook may be calculated (e.g., by codebook calculation circuit 522 or otherwise) in this step. This new codebook is then used for recoding block n−2 (e.g., entropy based compression circuit 524 performing entropy coding of block n−1 again using the new codebook). The recoded block of data n−2 may then replace the previously encoded version that used the codebook obtained from the data distribution obtained at time t1. Roll back of entropy coding as illustrated in FIG. 7B may be relatively rare (e.g., a data distribution of a portion of a data block may be sufficiently representative of the data distribution of the entire block for codebook calculation in most cases). Thus, while block n−2 is rolled back, blocks n−1 and n are not rolled back (e.g., divergence calculation for blocks n−1 and n may indicate a divergence between distributions of the partial and full blocks that are below a threshold). In some cases, the threshold for roll back may be a compression parameter that may be controlled dynamically during operation. In general, roll back allows higher compression rates and more efficient use of space in non-volatile memory but takes time and resources. Roll back may be used adaptively according to the system state. For example, a higher divergence may be required to trigger roll back at some times than at other times. At some times roll back (and divergence calculation) may be disabled (turned off). In other cases, such a threshold may be fixed and not controlled.

Figure 7C:
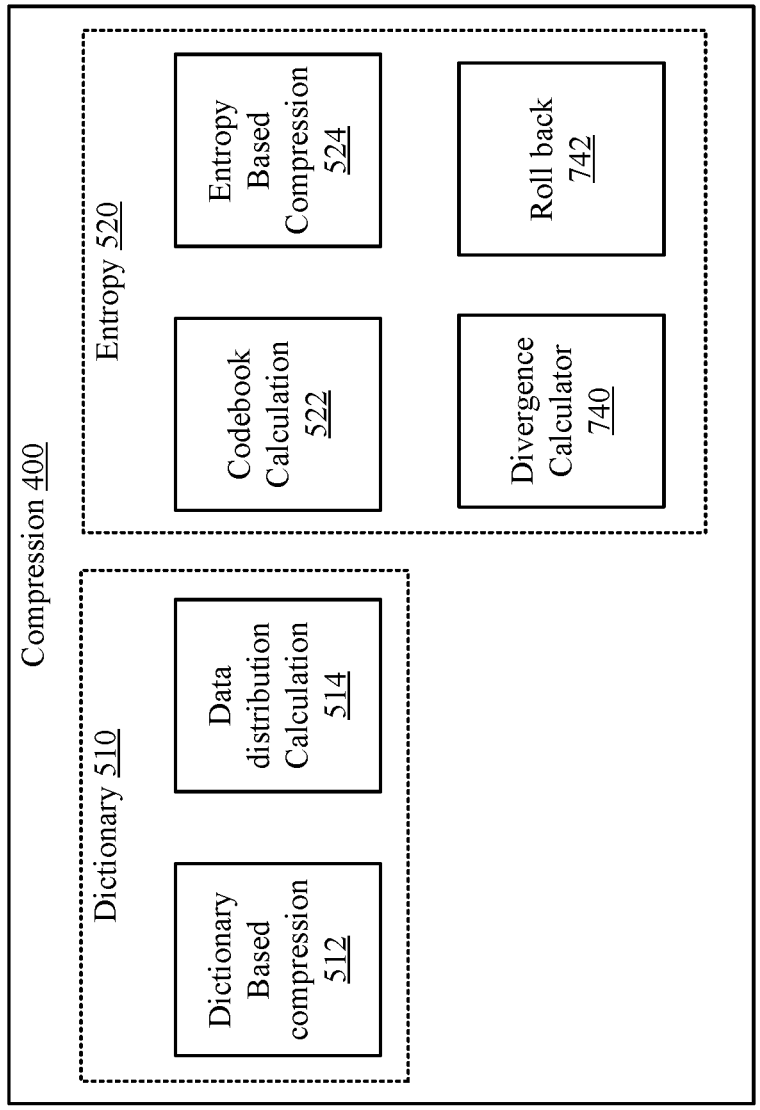

FIG. 7C shows an example of compression circuits 400 adapted to implement roll back of entropy coding in response to a divergence exceeding a threshold. Entropy encoder circuit 520 includes codebook calculation circuit 522 and entropy based compression circuit 524 as before. In addition, entropy encoder circuit 520 includes divergence calculator 740, which may receive data distributions from data distribution calculation circuit 514 (e.g., a first distribution for a partial block that is used to generate a first codebook and a second distribution for a complete block) and generates a value that indicates the divergence between the distributions (e.g., KL divergence value). A roll back circuit 742 may receive the value from divergence calculator 740 and compare it with a threshold for roll back (which may be a fixed value or a parameter that is changed dynamically). If the divergence value exceeds the threshold, roll back circuit 742 may cause codebook calculation circuit 522 to calculate a new codebook using the distribution obtained from the complete block and may cause entropy based compression circuit 524 to recode the block using the recalculated codebook. The recoded block then replaces the previously encoded block.

In some cases, data may be substantially similar across two or more blocks of data (e.g., blocks of data that are close in a sequence of blocks may have similar distributions of symbols) so that a distribution from one block may be used to generate a codebook for encoding another nearby block.

Figure 8A:
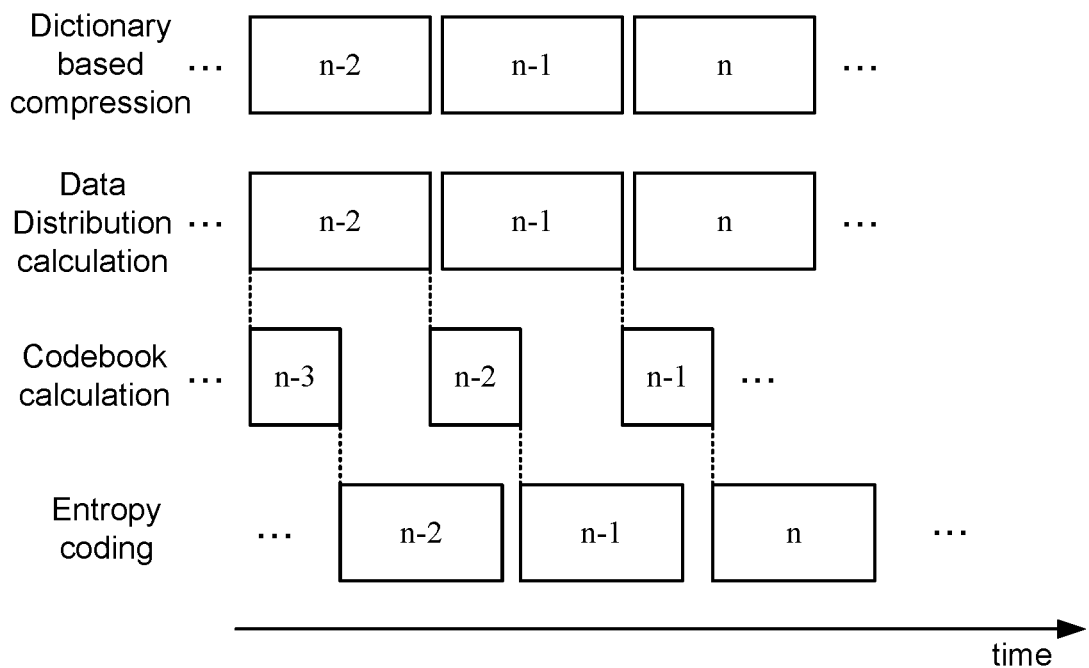
FIGS. 8A-D illustrate examples of compression including calculating a codebook for encoding a block of data from a different block of data.

FIG. 8A shows an example in which each block of data is encoded using a codebook calculated from an immediately prior block in a sequence of blocks of data. Dictionary based compression and data distribution calculation occur substantially in parallel for each block of data, followed by codebook calculation for each block (e.g., as previously shown in FIG. 6). After completion of the data distribution calculation for a given block of data (e.g., block n−2), the codebook is calculated from the complete distribution (a partial block could also be used as described above). The codebook obtained from the distribution of data of block n−2 is then used to encode block n−1 (used to encode an immediately subsequent block) and not to encode block n−2. This allows encoding of block n−1 to occur at least partially in parallel with dictionary based compression and data distribution calculation for block n−1.

While FIG. 8A shows an example in which the codebook used to encode a block is based on the distribution of another block that is immediately prior to the block of data, the codebook may alternatively be based on the distribution(s) of data of a nearby block or blocks other than the immediately prior block.

Figure 8B:
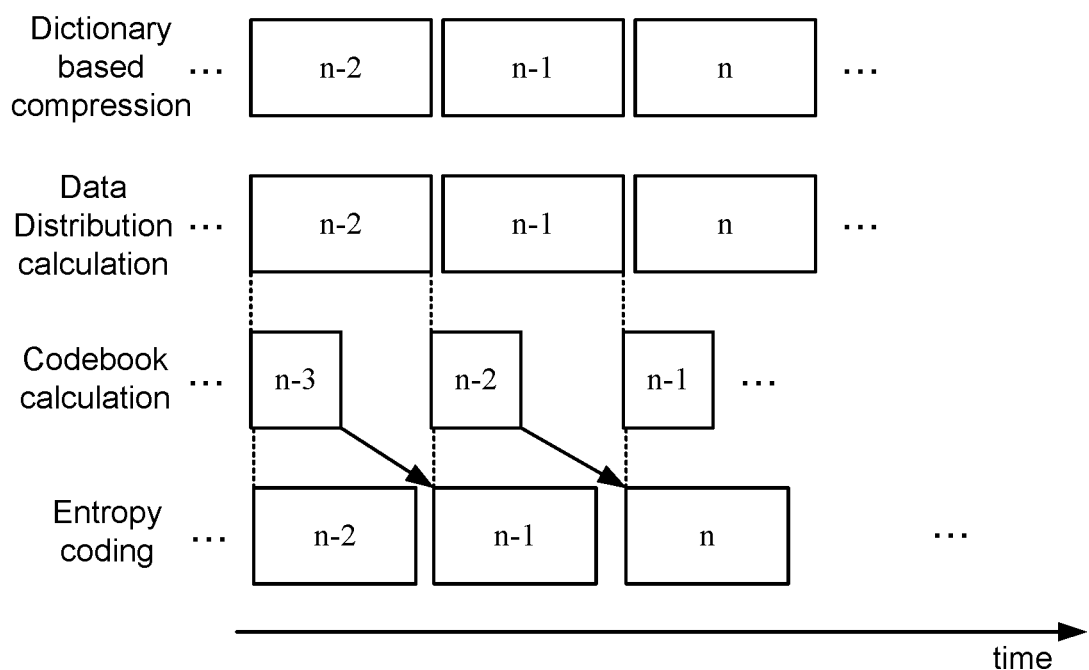

FIG. 8B illustrates an example in which the codebook used to encode a block of data is based on the distribution of data of a prior block of data that is separated from the block of data by an intervening block of data. For example, as previously shown (e.g., in FIGS. 6 and 8A), dictionary based compression and data distribution calculation occur in parallel for each block, followed by codebook calculation for each block. In the example of FIG. 8B, a codebook used to encode a given block is obtained from distribution of a block that is separated from the block by a single intervening block (not the block immediately prior to the block being encoded as in FIG. 8A). For example, after calculation of a codebook based on the distribution of data of block n−2, this codebook is used to perform entropy encoding on block n. Similarly, a codebook based on the distribution of data of block n−3 is used to encode block n−1. This scheme allows entropy coding of a given block to occur in parallel with dictionary based compression and data distribution calculation for the block and thus provides low latency and may use relatively simple circuits (e.g., small buffers).

While the examples of FIGS. 8A-B show two examples of how distributions from different blocks may be used to generate a codebook for a given block, the present technology is not limited to these examples and any block or blocks may be used to generate a codebook. For example, a codebook may be generated by combining distributions of two or more prior blocks or a codebook from a distribution of a block may continue to be used for a number of subsequent blocks if the data is known to be uniform across the blocks (e.g., if the host indicates that the data is uniform, or this is otherwise known).

Figure 8C:
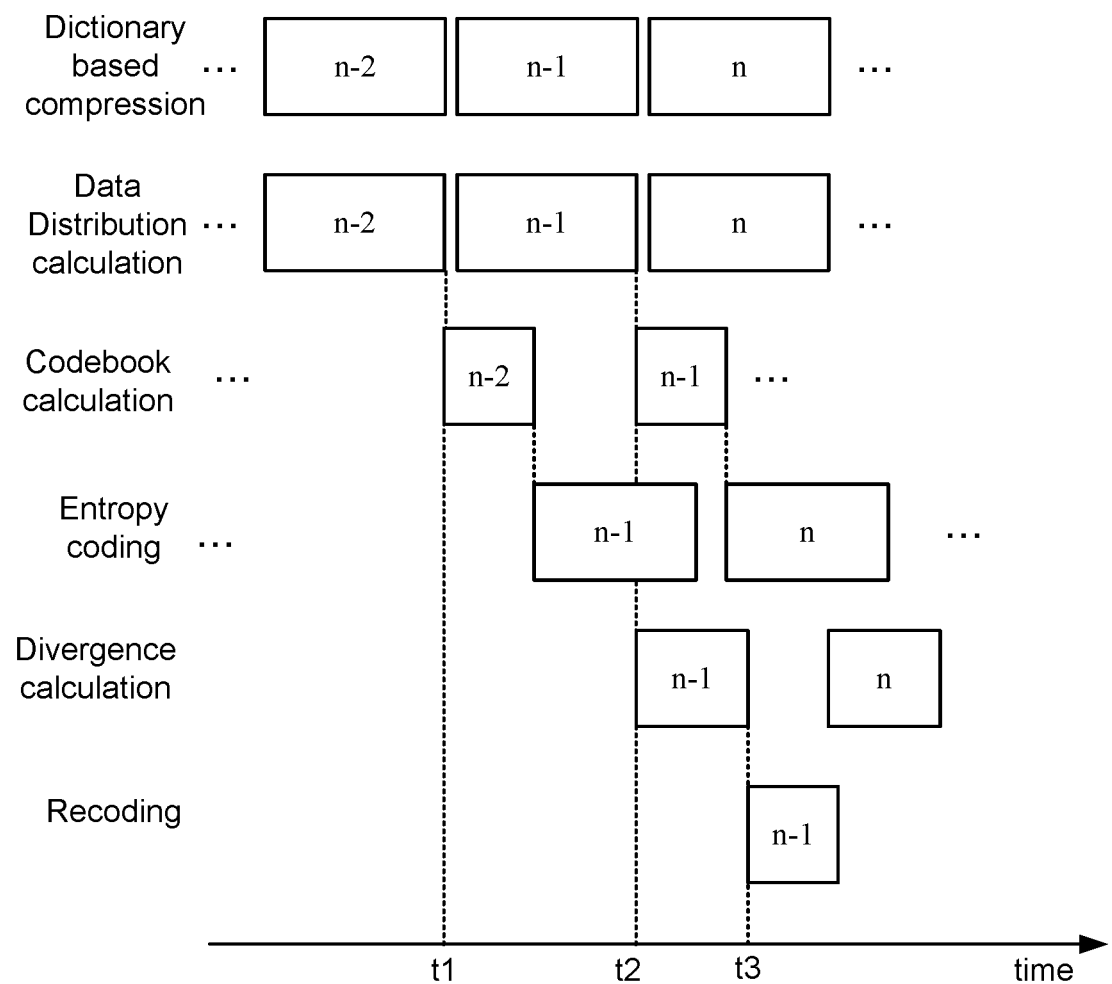

Like the example of FIG. 7A, the examples of FIGS. 8A-B may be configured to allow roll back in some examples. FIG. 8C illustrates an embodiment that corresponds to the example of FIG. 8A with roll back. As in FIG. 8A, dictionary based compression and data distribution calculation occur in parallel for each block, followed by codebook calculation based on each block's distribution and encoding of the subsequent block using the codebook. For example, at time t1, after completion of data distribution calculation for block n−2, codebook calculation based on the distribution of data of block n−2 begins and this codebook is used for entropy coding of block n−1. At time t2, the data distribution calculation for block n−1 is completed and a divergence calculation starts to compare the distribution of block n−1 with the distribution of block n−2 (which is used for entropy coding of block n−1). If the divergence between these distributions exceeds a threshold (as in the example of FIG. 8C) then recoding of block n−2 begins at time t3. Recoding may use the codebook based on block n−1 (which was generated between times t2 and t3 and is also used to encode block n) to encode block n−1 again. The recoded version may then replace the previous version (the version encoded using the codebook obtained from the distribution of block n−2). The circuits used to implement roll back in this example may be similar to those used for roll back in the previous example (e.g., as illustrated in FIG. 7C).

Figure 8D:
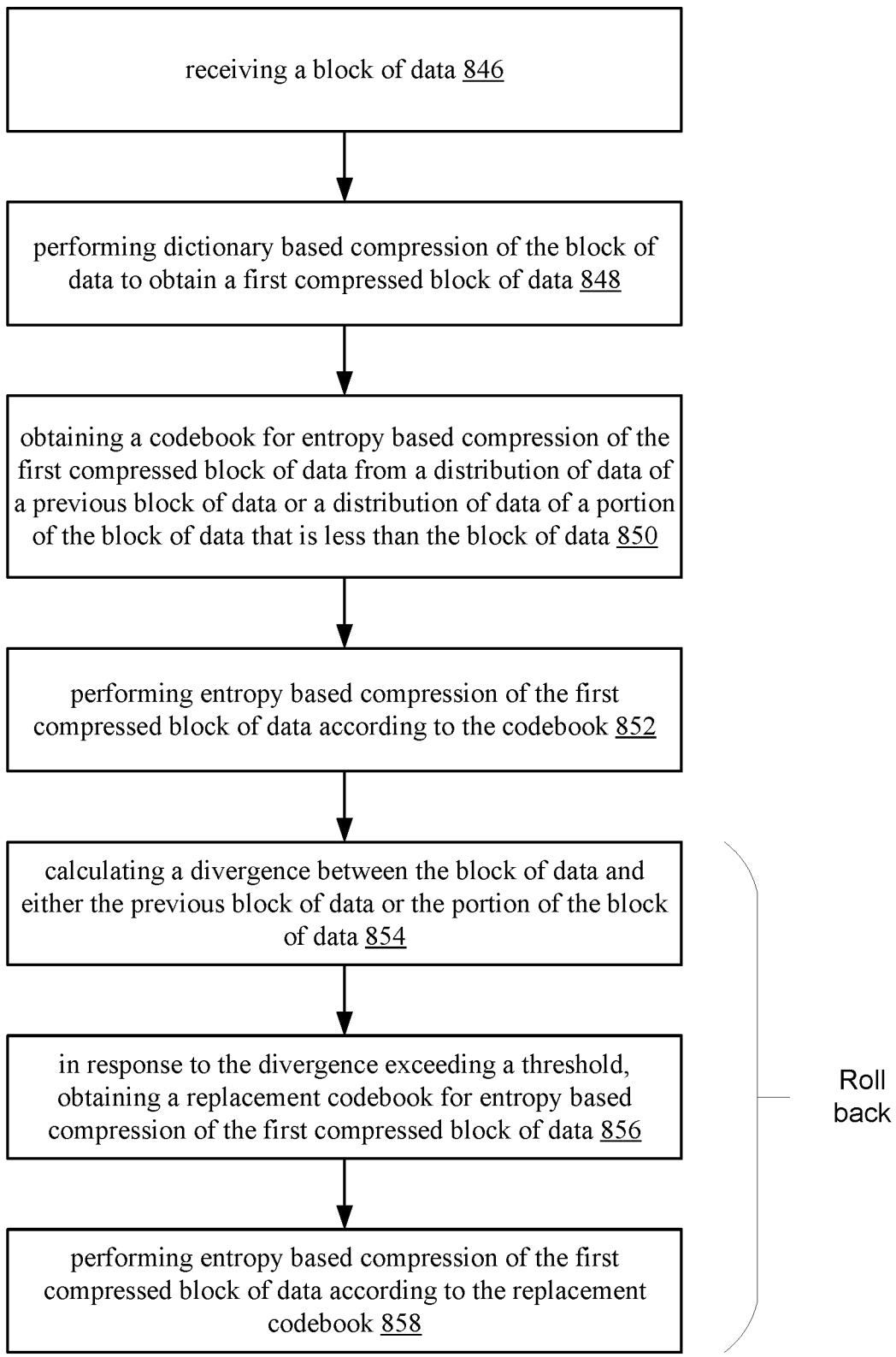

FIG. 8D shows a flowchart corresponding to the examples of FIGS. 7A-8C including roll back (which may be considered optional). The method illustrated in FIG. 8D includes receiving a block of data 846, performing dictionary based compression of the block of data to obtain a first compressed block of data 848, obtaining a codebook for entropy based compression of the first compressed block of data from a distribution of data of a previous block of data (e.g., as illustrated in FIGS. 8A-C) or a distribution of data of a portion of the block of data that is less than the block of data (e.g., as illustrated in FIGS. 7A-B), and performing entropy based compression of the first compressed block of data according to the codebook 852. FIG. 8D also shows additional (optional) roll back steps including calculating a divergence between the block of data and either the previous block of data or the portion of the block of data 854, in response to the divergence exceeding a threshold, obtaining a replacement codebook for entropy based compression of the first compressed block of data 856, and performing entropy based compression of the first compressed block of data according to the replacement codebook 858.

While the examples above include codebook calculation, which involves allocating bit strings to all symbols in a data distribution according to the respective number of times they occur in a block, a codebook may be obtained in other ways. For example, two or more codebooks may be calculated from samples of data with different distributions. A data sample may include one or more block of data so that each sample has a data distribution with a number of symbols that is similar to the number of symbols that may be found in a block. These codebooks may be stored so that they can be used rapidly at a later time without having to calculate them from scratch. When entropy based compression is to be applied to a block of data, the distribution of data in the block may be compared with the distributions of the one or more samples and the closest sample (the one having the smallest divergence with the distribution of the block to be encoded) may be identified. The previously-calculated codebook corresponding to the identified sample is then selected to encode the data. Because codebooks are calculated prior to being needed (e.g., offline at some prior time) this approach may allow rapid encoding.

Figure 9:
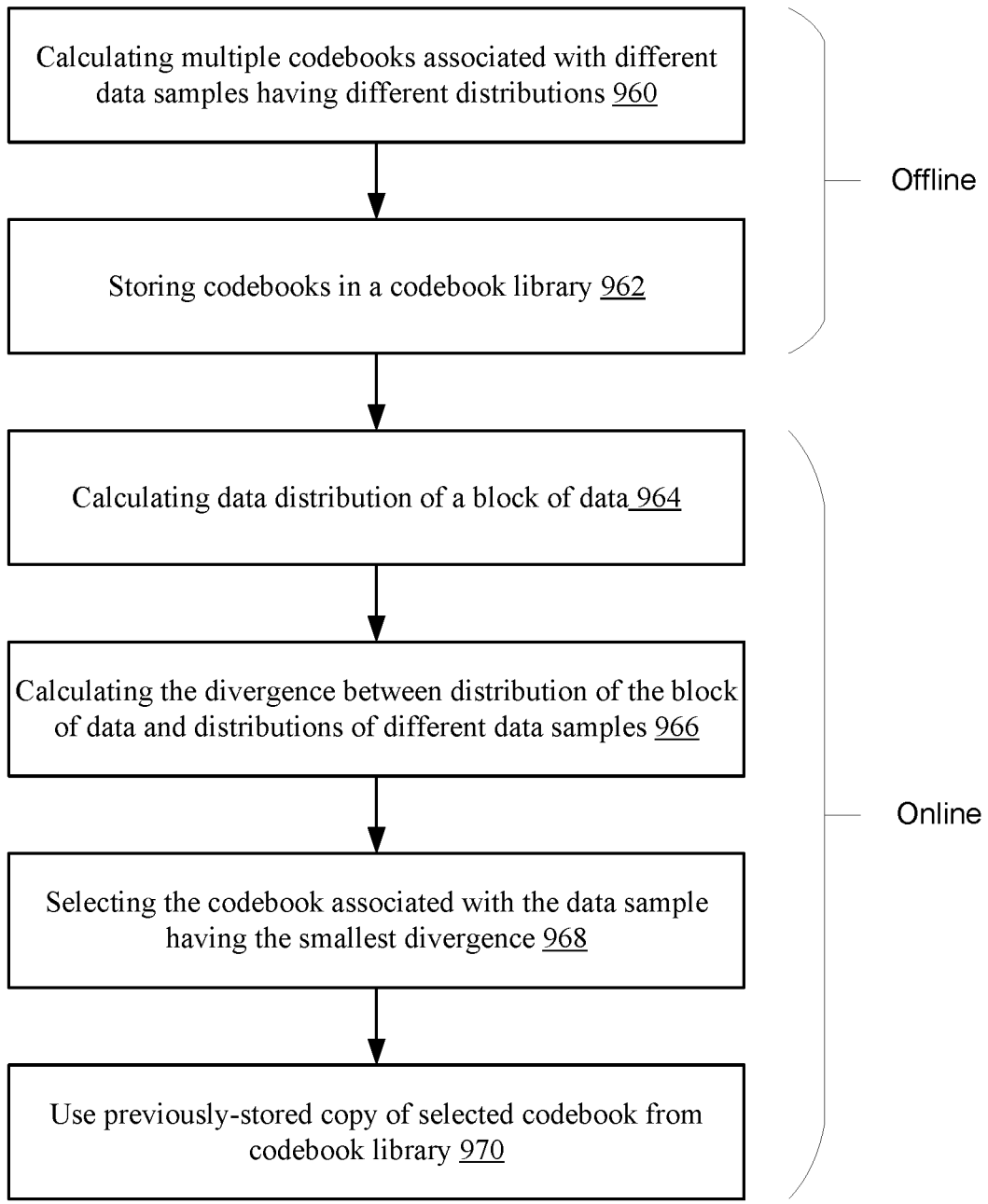
FIG. 9 illustrates an example of a method that includes selecting a codebook for entropy compression from a library of previously-calculated codebooks.

FIG. 9 shows an example of a method of obtaining a codebook using previously calculated codebooks (e.g., codebooks that are calculated offline, prior to compression of data). The method illustrated in FIG. 9 may provide an alternative to codebook calculation in any of the previous examples (e.g., codebook calculation circuit 522 may be configured to perform the steps of FIG. 9 or may be replaced with suitable circuits to perform the steps of FIG. 9). The method shown in FIG. 9 includes calculating multiple codebooks associated with different data samples having different distributions 960 and storing the codebooks in a codebook library 962. These steps may be performed offline (e.g., at a time prior to compressing data, as part of configuration of a compression circuit such as compression circuits 400). The method further includes calculating the data distribution of a block of data 964, calculating the divergence (e.g., KL divergence) between the distribution of the block of data and distributions of different data samples 966. For example, the divergence may be calculated for each data sample in the codebook library or for some subset of the data samples in the codebook library. The method also includes selecting the codebook associated with the data sample having the smallest divergence 968 and using the previously-stored copy of the selected codebook from the codebook library 970. Because the codebooks used in this method are previously-stored and not calculated as-needed from the data to be encoded, codebooks may be rapidly accessed. While divergence may be calculated for all data samples as illustrated, in other examples, divergence may be calculated for a subset of all data samples. For example, divergence may be calculated until a data sample is found with a distribution that is close enough for encoding (e.g., has a divergence with the data to be encoded that is less than a threshold). The use of previously-calculated codebooks (instead of calculating individual codebooks from blocks of data to be encoded) may be implemented in response to the system state so that a compression parameter may be whether to calculate codebooks or use previously-calculated codebooks. When previously-calculated codebooks are used, compression parameters may include how the codebook is selected (e.g., whether to calculate divergence for all sample data to obtain the closest codebook or calculate divergence until sample data is found with divergence less than a threshold, indicating a sufficiently good codebook).

Figure 10:
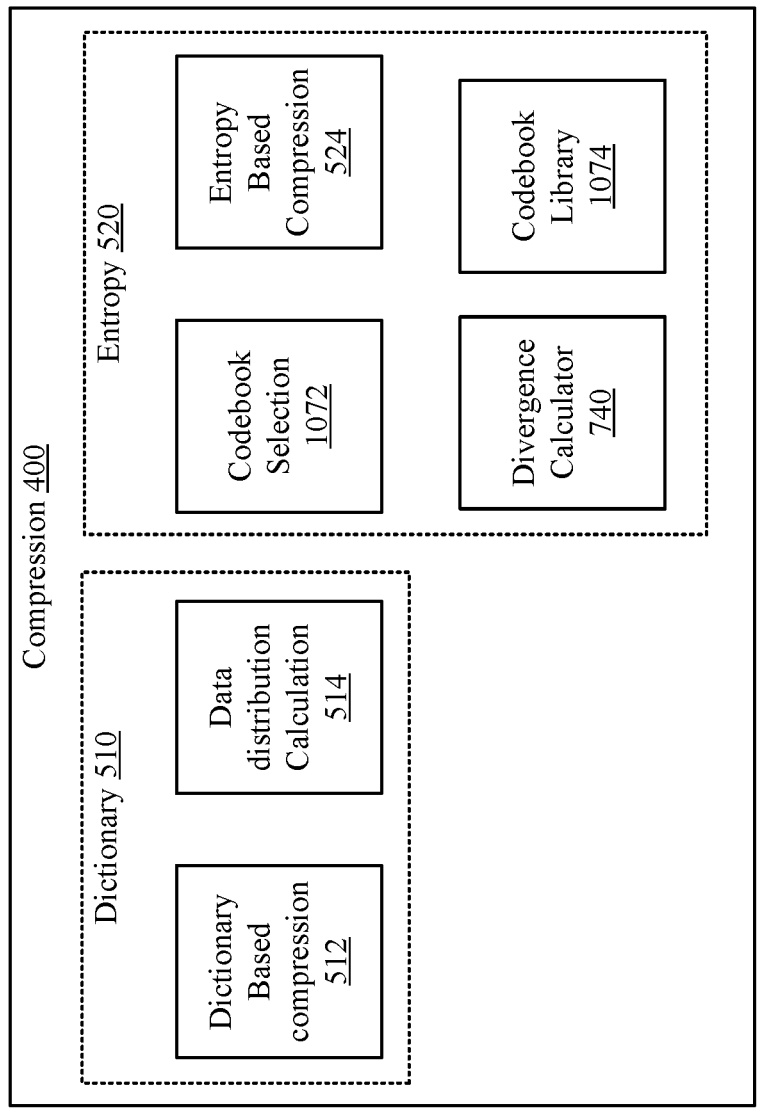
FIG. 10 illustrates an example of a compression circuit that includes a codebook selection circuit and a codebook library.

FIG. 10 illustrates an example of compression circuits 400 configured to use previously-calculated codebooks stored in a codebook library (e.g., as illustrated in the method of FIG. 9). Entropy encoder circuit 520 includes codebook selection circuit 1072, which is configured to select a previously-calculated codebook from codebook library 1074. Divergence calculator 740 may calculate divergence (e.g., KL divergence) between a data distribution obtained from data distribution calculation circuit 514 and two or more data distributions associated with codebooks in codebook library 1074 and may provide the results (divergence values) to codebook selection circuit 1072. The selected codebook is then used by entropy based compression circuit 524 to compress the block of data.

While the examples of FIGS. 9-10 include selecting a codebook from the codebook library so that codebook calculation of codebooks is unnecessary when performing compression, in other examples calculation of codebooks may be simplified by constraining the code to using a particular structure.

Figure 11A:
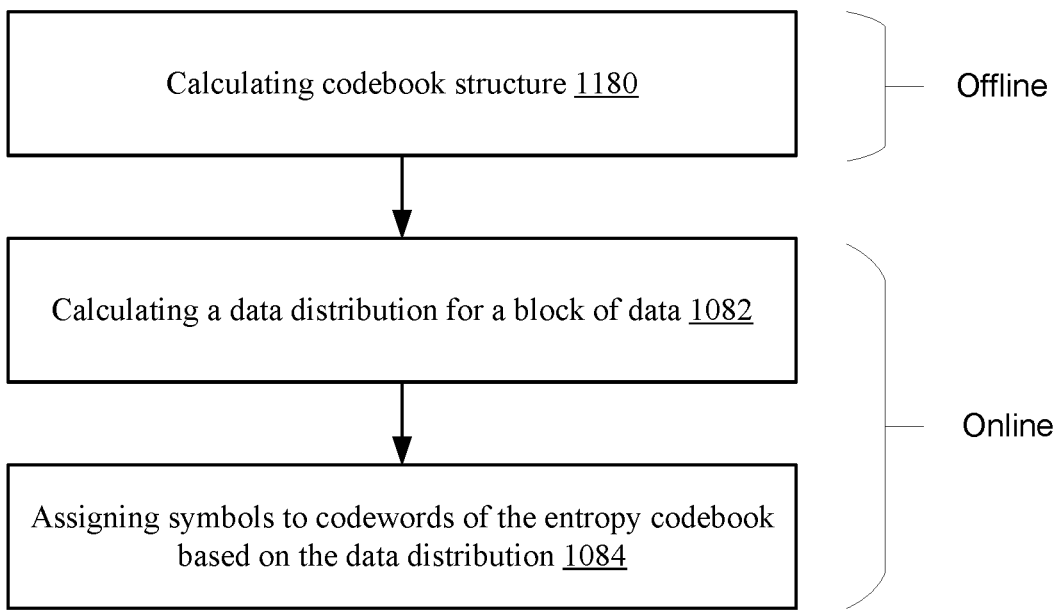
FIGS. 11A-D illustrate an example of compression using a previously-calculated codebook structure with symbols mapped to bit strings according to distributions.

FIG. 11A illustrates an example of a method that includes calculating a codebook structure 1180. This step may be performed offline. The method further includes calculating a data distribution for a block of data 1082 and assigning symbols to codewords of the entropy codebook based on the data distribution 1084.

Figure 11B:
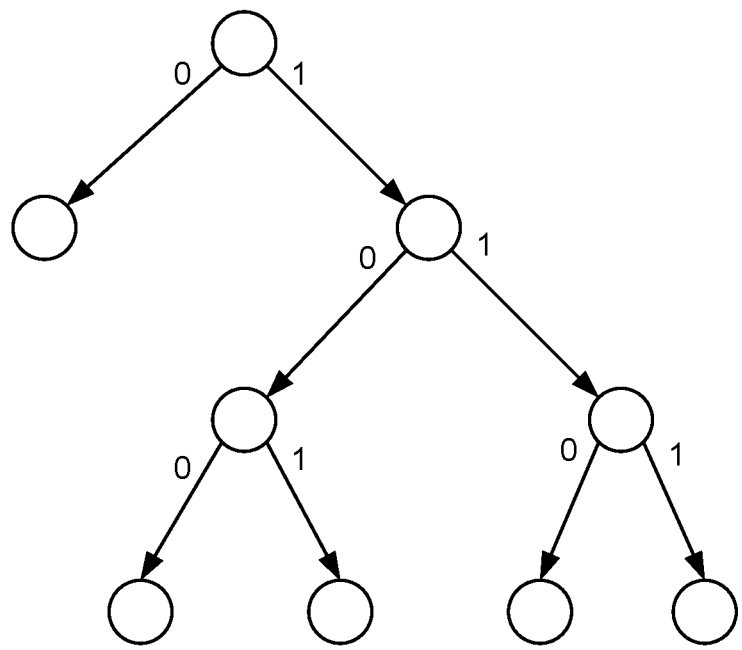

FIG. 11B shows an example of a codebook structure (a tree structure) that may be calculated at step 1180. For example, some entropy codes such as Huffman codes are prefix codes that can be represented by a tree (e.g., Huffman tree). Each symbol is represented by the bit string (codeword) along the path from the root of the tree to the leaf with the corresponding symbol. While one symbol is represented by a single-bit (0) the other four symbols in this structure are represented by three bits (each three bit combination that begins with "1", including 111, 110, 101 and 100). When entropy encoding is constrained to such a tree (or other codebook structure) the codebook can be rapidly generated (e.g., more rapidly than if it is calculated from scratch including selecting a tree structure).

Figure 11C:
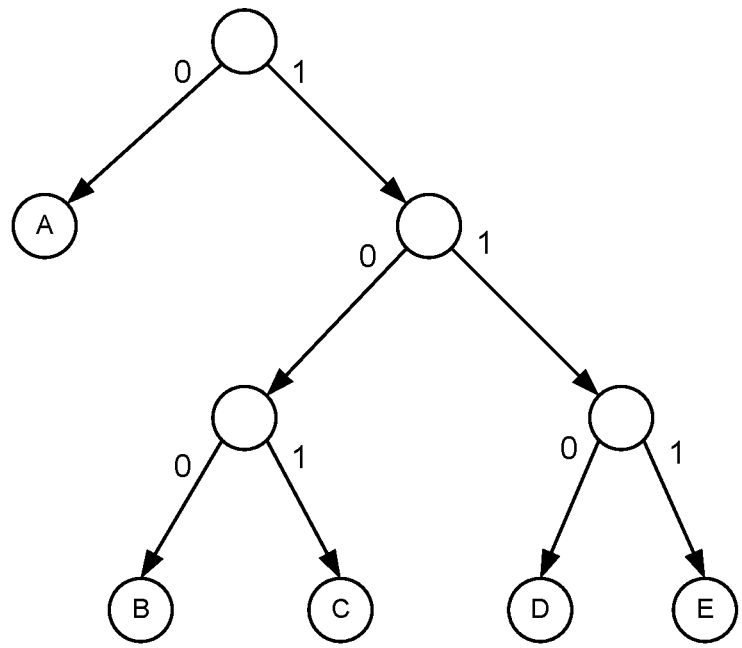

FIG. 11C shows a first example of a mapping of symbols to codewords using the previously-calculated Huffman tree of FIG. 11B. For example, this mapping may be a default mapping or a mapping resulting from assigning of step 1084 for a first block. For example, the first block may have a large number of occurrences of the symbol "A" so that representing "A" with a single bit ("0") may be efficient. Symbols B, C, D, and E may be less common and so are represented with three-bit strings along their respective paths (100, 101, 110, and 111 respectively). While Figure C provides an illustration of the tree structure, the code may be represented and stored in the form of a table such as the example of Table 1 below, illustrating the codebook of FIG. 11C. Such a codebook may be used for entropy compression (e.g., by entropy based compression circuit 524).

TABLE 1

| A | 0 |
|---|---|
| B | 100 |
| C | 101 |
| D | 110 |
| E | 111 |

Figure 11D:
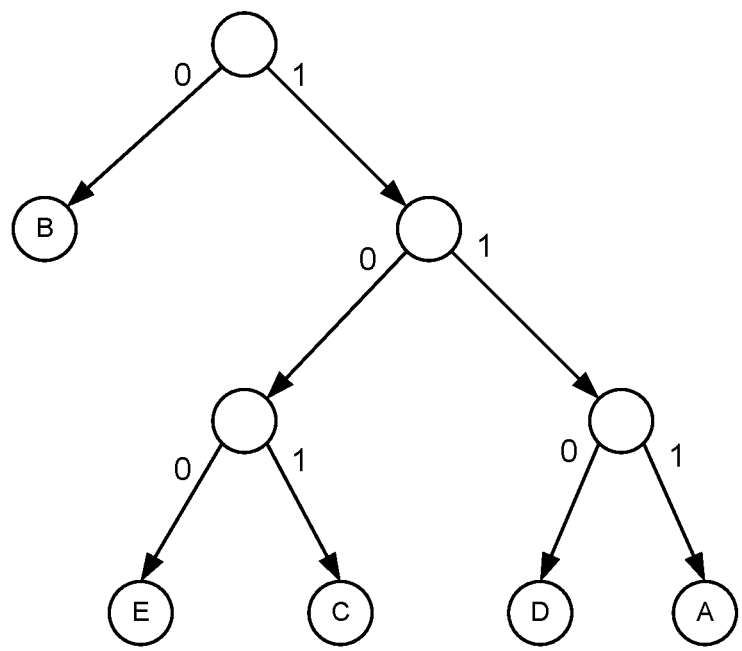

FIG. 11D shows a second example of a mapping of symbols to codewords using the Huffman tree of FIG. 11B. This mapping may result from the assigning step 1084 for a second block that has a different distribution of data than the first block. For example, the second block may have a large number of occurrences of the symbol "B" (larger than other symbols) so that representing "B" with a single bit ("0") may be efficient. Symbols A, C, D and E may be less common and so they are represented with three-bit strings along their respective paths (111, 101, 110, and 100 respectively). Table 2 shows the codebook of the example of FIG. 11D, which uses the same bit strings as in FIG. 11C, with different assignment of bit strings to symbols. A predefined codebook structure may simplify entropy coding (calculating a codebook may simply assign the symbols to the bit strings defined by the structure).

TABLE 2

| A | 111 |
|---|---|
| B | 0 |
| C | 101 |
| D | 110 |
| E | 111 |

While the Huffman tree illustrated in FIGS. 11B-D is simple for illustration, more complex trees (more than five symbols represented by bit strings of more than two lengths, some having more than three bits) may also be used. While generating a codebook using a simple structure may be faster, a more complex structure may enable more efficient compression. The complexity of the structure used may be a compression parameter that is controlled according to the system state, with different structures used at different times for different blocks of data. In some cases, a default symbol to codeword mapping may be used at certain times instead of identifying a mapping based on a distribution of data in a block (e.g., in order to rapidly encode data). Compression parameters may include which structure to use (how complex) and whether to use a default mapping or to find a mapping based on the distribution of data.

The above examples include different approaches to compression that may be used individually or may be combined in a number of ways in either a static manner (e.g., fixed compression for all blocks of data) or in an adaptive manner (e.g., different compression for different blocks of data). For example, using a distribution of a partial block of data to obtain a codebook (e.g., as illustrated in FIG. 7A) may be combined with using a different block than the block to be encoded (e.g., as illustrated in FIGS. 8A-B). A distribution obtained from a partial or complete block may be compared with distributions corresponding to previously-calculated codebooks and a codebook may be selected or calculated accordingly (e.g., if there is a previously-calculated codebook that is based on data that is adequate (divergence less than a threshold) the previously-calculated codebook may be used, otherwise a codebook may be calculated). Compression parameters, including any of the compression parameters discussed above, may be controlled during compression of data (e.g., changed from block to block when compressing a plurality of blocks of data according to the system state).

Figure 12:
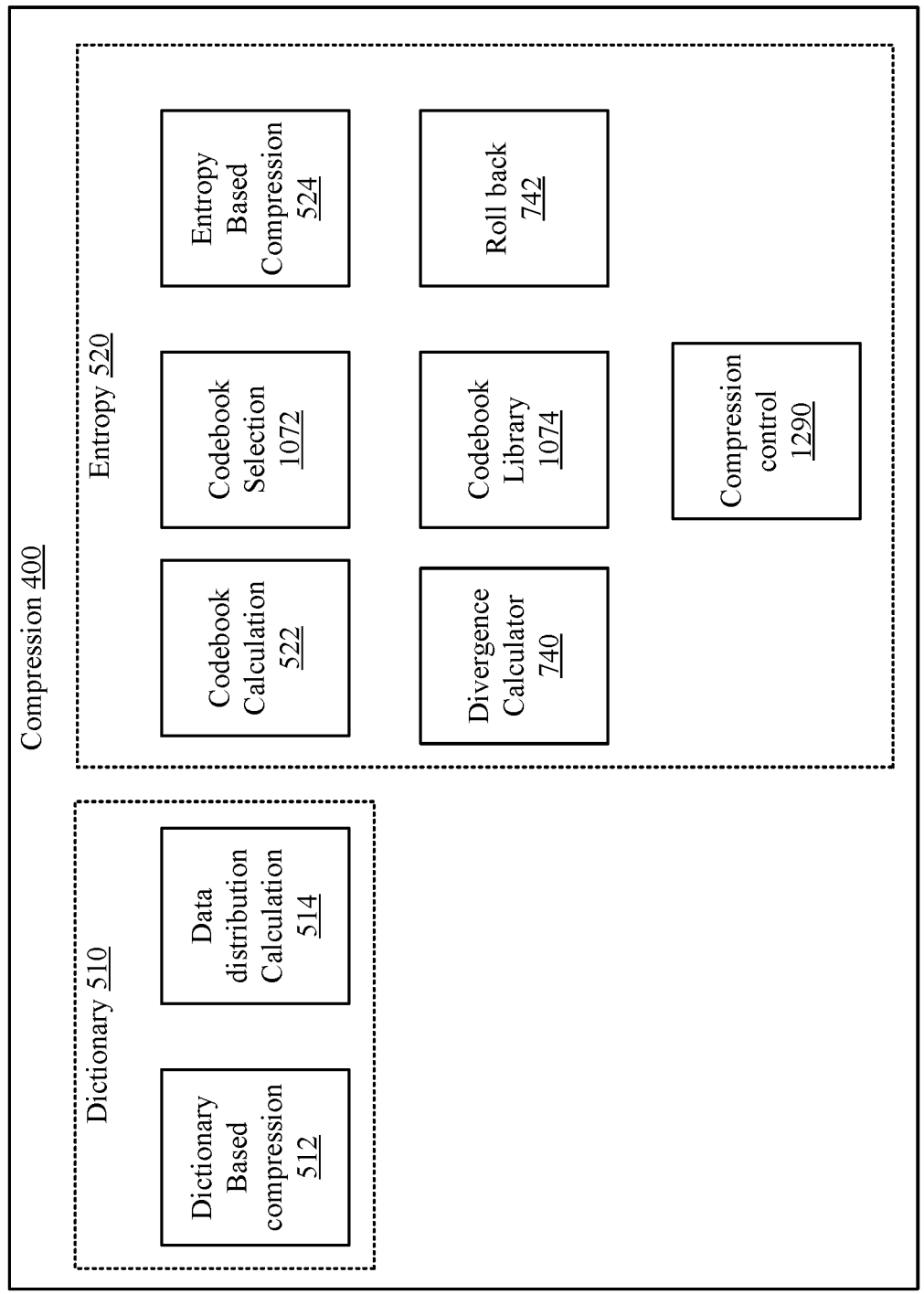
FIG. 12 illustrates an example of a compression circuit that includes a compression control circuit to control compression parameters dynamically.

FIG. 12 shows an example of compression circuits 400 configured for adaptive compression. Entropy encoder circuit 520 includes both codebook calculation circuit 522 and codebook selection circuit 1072 so that a codebook may be calculated or may be selected from codebook library 1074 (e.g., depending on divergence calculated by divergence calculator 740). Entropy based compression circuit 524 encodes data using the codebook calculated/selected and roll back circuit 742 allows roll back of encoding (e.g., in response to divergence calculator 740 finding a divergence greater than a threshold between a block of data and the data from which the codebook was generated.

Entropy encoder further includes compression control circuit 1290, which may dynamically control compression parameters, including any of the compression parameters discussed above, used in entropy encoder circuit 520 according to the system state. For example, compression control circuit 1290 may obtain information regarding a throughput requirement for storage of data (e.g., from a host), an amount of buffered data (e.g., how full one or more buffers are), information regarding one or more command queues (e.g., uncompleted write commands in queues), information regarding remaining unused memory capacity, or other information that may indicate the relative importance of compressing data rapidly (e.g., to meet a throughput requirement, free buffer capacity, reduce the number of commands in command queues) and compressing data efficiently (e.g., to efficiently use space in non-volatile memory).

Figure 13:
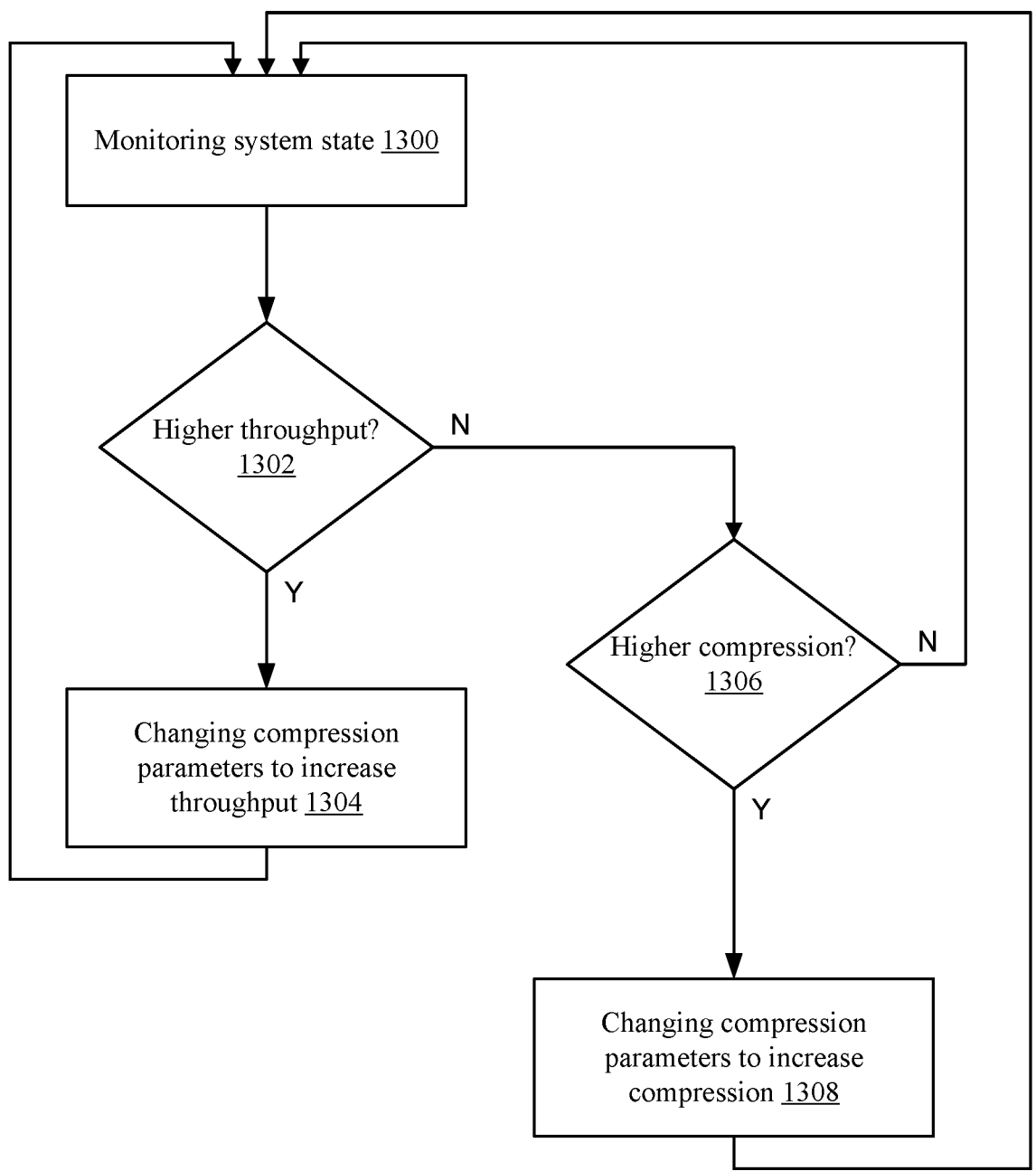
FIG. 13 shows a flowchart that illustrates a method of operation of compression control circuit.

FIG. 13 shows a flowchart that illustrates a method of operation of compression control circuit 1290 in compression circuits 400. The method includes monitoring the system state 1300 (e.g., monitoring one or more queues, buffers, inputs from a host, and/or other conditions) and making a determination 1302 as to whether higher throughput is appropriate (e.g., buffer(s) and/or command queue(s) full or near full, host requires higher throughput, or otherwise). If it is determined that higher throughput is appropriate, the method includes changing compression parameters to increase throughput 1304. For example, calculating codebooks from distributions of data of complete or partial blocks of data could be changed to calculating codebooks from partial blocks or smaller partial blocks, changed to using previously-calculated codebooks from a codebook library, and roll back could be disabled or reduced (e.g., increasing a threshold divergence that causes roll back of a block). If higher throughput is not needed, a determination 1306 is made as to whether higher compression is appropriate (e.g., available space in non-volatile memory is low). In some cases, higher compression may be used whenever throughput requirements are lowered (e.g., data may be compressed as much as throughput requirements allow). If higher compression is appropriate, the method includes changing compression parameters to increase compression (e.g., calculating codebooks from data distributions of complete blocks or larger portions of blocks, enabling or increasing roll back (e.g., reducing a threshold divergence that causes roll back of a block).

An example of an apparatus includes a first encoder circuit configured to compress a block of data using dictionary based compression; and a second encoder circuit connected to the first encoder circuit to receive the compressed block of data from the first encoder circuit and to further compress the compressed block of data according to a codebook, wherein the codebook is based on a distribution of data of a prior block of data or a distribution of data of a portion of the block of data that is less than the block of data.

The codebook may be based on the distribution of data of a prior block of data that is immediately prior to the block of data. The codebook may be based on the distribution of data of a prior block of data that is separated from the block of data by at least one intervening block of data. The codebook may be based on a distribution of a first portion of the block of data that is received prior to at least a second portion of the block of data. The apparatus may include a divergence calculator to calculate a divergence between blocks of data. The divergence calculator may be configured to calculate divergence between the block of data and the data of the prior block or the data of the portion of the block. The apparatus may include a roll back circuit configured to cause recalculation of a codebook for the block of data and recoding of the block of data according to the recalculated codebook in response to the divergence exceeding a threshold. The apparatus may include a codebook calculation circuit configured to calculate the codebook from the distribution of data of the prior block of data or the distribution of data of the portion of the block of data. The apparatus may include a codebook selection circuit configured to select a codebook from a codebook library that contains a plurality of previously-calculated codebooks. The apparatus may include a codebook calculation circuit configured to determine a mapping of codewords to symbols, the codewords forming a previously-calculated structure. The apparatus may include a compression control circuit configured to control one or more compression parameters of the second encoder circuit according to a system state.

An example of a method includes receiving a block of data; performing dictionary based compression of the block of data to obtain a first compressed block of data; obtaining a codebook for entropy based compression of the first compressed block of data from a distribution of data of a previous block of data or a distribution of data of a portion of the block of data that is less than the block of data; and performing entropy based compression of the first compressed block of data according to the codebook.

The method may include calculating a divergence between the block of data and either the previous block of data or the portion of the block of data. The method may include, in response to the divergence exceeding a threshold, obtaining a replacement codebook for entropy based compression of the first compressed block of data; and performing entropy based compression of the first compressed block of data according to the replacement codebook. The method may further include obtaining the codebook by selecting from a library of previously-calculated codebooks. The block of data may be one of a plurality of blocks of data and the method may further include changing entropy based compression of the plurality of blocks of data including one or more of: changing between calculating a codebook for a first one or more of the plurality of blocks of data and selecting the codebook by selecting from a library of previously-calculated codebooks for a second one or more of the plurality of blocks of data; changing between using a first fraction of a first one or more of the plurality of blocks of data to obtain corresponding codebooks and using a second fraction of a second one or more of the plurality of blocks of data to obtain corresponding codebooks; and changing between enabling roll back of encoding of a first one or more of the plurality of blocks of data and disabling roll back of encoding of a second one or more of the plurality of blocks of data.

An example of a data storage system includes a first encoder circuit configured to compress a plurality of blocks of data received from a host using dictionary based compression; a second encoder circuit connected to the first encoder circuit to receive the compressed blocks of data from the first encoder circuit and to further compress the compressed blocks of data according to one or more codebooks; a compression control circuit configured to control the second encoder circuit according to a system state; and a non-volatile memory connected to the second encoder circuit to receive and store the block of data compressed according to the one or more codebooks.

The codebook for an individual block of data may be based on a distribution of data of a previous block of data or a distribution of data of a portion of the individual block of data that is less than the entire individual block of data. The compression control circuit may be configured to change one or more compression parameters in response to a change in the system state, the one or more compression parameters including at least one of: a fraction of a block of data to use to calculate the one or more codebooks, which blocks of data to use to calculate the one or more codebooks, whether to enable roll back of encoding, and whether to enable selection of the one or more codebooks from a plurality of previously-calculated codebooks. The first encoder circuit may be configured to compress the plurality of blocks of data using LZ77 encoding, and the second encoder circuit is configured to further compress the compressed block of data using Huffman encoding.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus comprising:
a first encoder circuit configured to compress a block of data using dictionary based compression; and
a second encoder circuit connected to the first encoder circuit to receive the compressed block of data from the first encoder circuit and to further compress the compressed block of data according to a codebook, wherein the codebook is based on a distribution of data of a prior block of data that is immediately prior to the block of data or a prior block of data that is separated from the block of data by at least one intervening block of data or based on a distribution of data of a first portion of the block of data that is received prior to at least a second portion of the block of data.

2. The apparatus of claim 1, wherein the codebook is based on the distribution of data of the prior block of data that is immediately prior to the block of data.

3. The apparatus of claim 1, wherein the codebook is based on the distribution of data of the prior block of data that is separated from the block of data by at least one intervening block of data.

4. The apparatus of claim 1, wherein the codebook is based on the distribution of the first portion of the block of data.

5. The apparatus of claim 1, wherein the second encoder circuit further comprises a divergence calculator to calculate a divergence between blocks of data.

6. The apparatus of claim 5, wherein the divergence calculator is configured to calculate divergence between the block of data and the data of the prior block or the data of the portion of the block.

7. The apparatus of claim 6, wherein the second encoder circuit further comprises a roll back circuit configured to cause recalculation of a codebook for the block of data and recoding of the block of data according to the recalculated codebook in response to the divergence exceeding a threshold.

8. The apparatus of claim 1, wherein the second encoder circuit further comprises a codebook calculation circuit configured to calculate the codebook from the distribution of data of the prior block of data or the distribution of data of the first portion of the block of data.

9. The apparatus of claim 1, wherein the second encoder circuit further comprises a codebook selection circuit configured to select a codebook from a codebook library that contains a plurality of previously-calculated codebooks.

10. The apparatus of claim 1, wherein the second encoder circuit further comprises a codebook calculation circuit configured to determine a mapping of codewords to symbols, the codewords forming a previously-calculated structure.

11. The apparatus of claim 1, wherein the second encoder circuit further comprises a compression control circuit configured to control one or more compression parameters of the second encoder circuit according to a system state.

12. A method comprising:
receiving a block of data;
performing dictionary based compression of the block of data to obtain a first compressed block of data;

obtaining a codebook for entropy based compression of the first compressed block of data from a distribution of data of a previous block of data or a distribution of data of a portion of the block of data that is less than the block of data, the codebook obtained by selecting from a library of previously-calculated codebooks; and performing entropy based compression of the first compressed block of data according to the codebook.

13. The method of claim 12, further comprising calculating a divergence between the block of data and either the previous block of data or the portion of the block of data.

14. The method of claim 13, further comprising:
in response to the divergence exceeding a threshold, obtaining a replacement codebook for entropy based compression of the first compressed block of data; and
performing entropy based compression of the first compressed block of data according to the replacement codebook.

15. The method of claim 12 further comprising controlling the entropy based compression according to a system state.

16. The method of claim 12, wherein the block of data is one of a plurality of blocks of data, the method further comprising:
changing entropy based compression of the plurality of blocks of data including one or more of:
changing between calculating a codebook for a first one or more of the plurality of blocks of data and selecting the codebook by selecting from a library of previously-calculated codebooks for a second one or more of the plurality of blocks of data;
changing between using a first fraction of a first one or more of the plurality of blocks of data to obtain corresponding codebooks and using a second fraction of a second one or more of the plurality of blocks of data to obtain corresponding codebooks; and
changing between enabling roll back of encoding of a first one or more of the plurality of blocks of data and disabling roll back of encoding of a second one or more of the plurality of blocks of data.

17. A data storage system comprising:
a first encoder circuit configured to compress a plurality of blocks of data received from a host using dictionary based compression;
a second encoder circuit connected to the first encoder circuit to receive the compressed blocks of data from the first encoder circuit and to further compress the compressed blocks of data according to one or more codebooks;
a compression control circuit configured to control the second encoder circuit according to a system state; and
a non-volatile memory connected to the second encoder circuit to receive and store the block of data compressed according to the one or more codebooks.

18. The data storage system of claim 17 wherein a codebook for an individual block of data is based on a distribution of data of a previous block of data or a distribution of data of a portion of the individual block of data that is less than the entire individual block of data.

19. The data storage system of claim 17 wherein the compression control circuit is configured to change one or more compression parameters in response to a change in the system state, the one or more compression parameters including at least one of: a fraction of a block of data to use to calculate the one or more codebooks, which blocks of data to use to calculate the one or more codebooks, whether to enable roll back of encoding, and whether to enable selection of the one or more codebooks from a plurality of previously-calculated codebooks.

20. The data storage system of claim 17, wherein the first encoder circuit is configured to compress the plurality of blocks of data using Lempel-Ziv encoding and the second encoder circuit is configured to further compress the compressed block of data using Huffman encoding.

* * * * *